United States Patent
Pai et al.

(10) Patent No.: US 12,495,566 B2
(45) Date of Patent: Dec. 9, 2025

(54) SEMICONDUCTOR DEVICE HAVING STRAINED CHANNEL AND METHOD FOR MANUFACTURING THE SAME

(71) Applicant: TAIWAN SEMICONDUCTOR MANUFACTURING COMPANY, LTD., Hsinchu (TW)

(72) Inventors: Chia-Ling Pai, Hsinchu (TW); Hsiang-Pi Chang, Hsinchu (TW); Shen-Yang Lee, Hsinchu (TW); Fu-Ting Yen, Hsinchu (TW); Huang-Lin Chao, Hsinchu (TW); Pinyen Lin, Hsinchu (TW); I-Ming Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 452 days.

(21) Appl. No.: 18/186,248

(22) Filed: Mar. 20, 2023

(65) Prior Publication Data

US 2024/0322003 A1   Sep. 26, 2024

(51) Int. Cl.
*H10D 30/01* (2025.01)
*H10D 30/43* (2025.01)
*H10D 30/67* (2025.01)
*H10D 62/10* (2025.01)
*H10D 62/13* (2025.01)

(52) U.S. Cl.
CPC .......... *H10D 30/014* (2025.01); *H10D 30/43* (2025.01); *H10D 30/6735* (2025.01); *H10D 62/121* (2025.01); *H10D 62/151* (2025.01)

(58) Field of Classification Search
CPC .......... H10D 30/6735; H10D 30/6757; H10D 30/014; H10D 62/151
See application file for complete search history.

(56) References Cited

U.S. PATENT DOCUMENTS

| 2018/0190829 A1* | 7/2018 | Song | H01L 21/02532 |
| 2020/0118891 A1* | 4/2020 | Cheng | B82Y 10/00 |

\* cited by examiner

*Primary Examiner* — Changhyun Yi
(74) *Attorney, Agent, or Firm* — Birch, Stewart, Kolasch & Birch, LLP

(57) ABSTRACT

A method for manufacturing a semiconductor device includes: forming a semiconductor stack on a semiconductor substrate in a flat state, the semiconductor stack including sacrificial layer portions and channel layer portions that are alternately stacked over one another; forming source/drain trenches in the semiconductor stack, each of the source/drain trenches penetrating the channel layer portions, the sacrificial layer portions and an upper portion of the semiconductor substrate, and terminating at a lower portion of the semiconductor substrate, so as to form the channel layer portions into channel features and form the sacrificial layer portions into sacrificial features; transforming the semiconductor substrate from the flat state to a bending state; forming source/drain regions in the source/drain trenches, respectively; and reverting the semiconductor substrate from the bending state back to the flat state, so as to induce a strain in the channel features.

20 Claims, 23 Drawing Sheets

SEMICONDUCTOR DEVICE HAVING STRAINED CHANNEL AND METHOD FOR MANUFACTURING THE SAME

BACKGROUND

With rapid development of semiconductor technology, strain engineering technique is used in a semiconductor manufacturing process for enhancing transistor (e.g., a p-channel metal-oxide-semiconductor (PMOS) transistor or an n-channel metal-oxide-semiconductor (NMOS) transistor) performance. Through strain engineering, strain of a transistor channel can be modulated to enhance electron mobility or hole mobility in the transistor channel, further improving the transistor performance. In order to efficiently modulate the strain of the transistor channel, innovative approaches in strain engineering are in continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
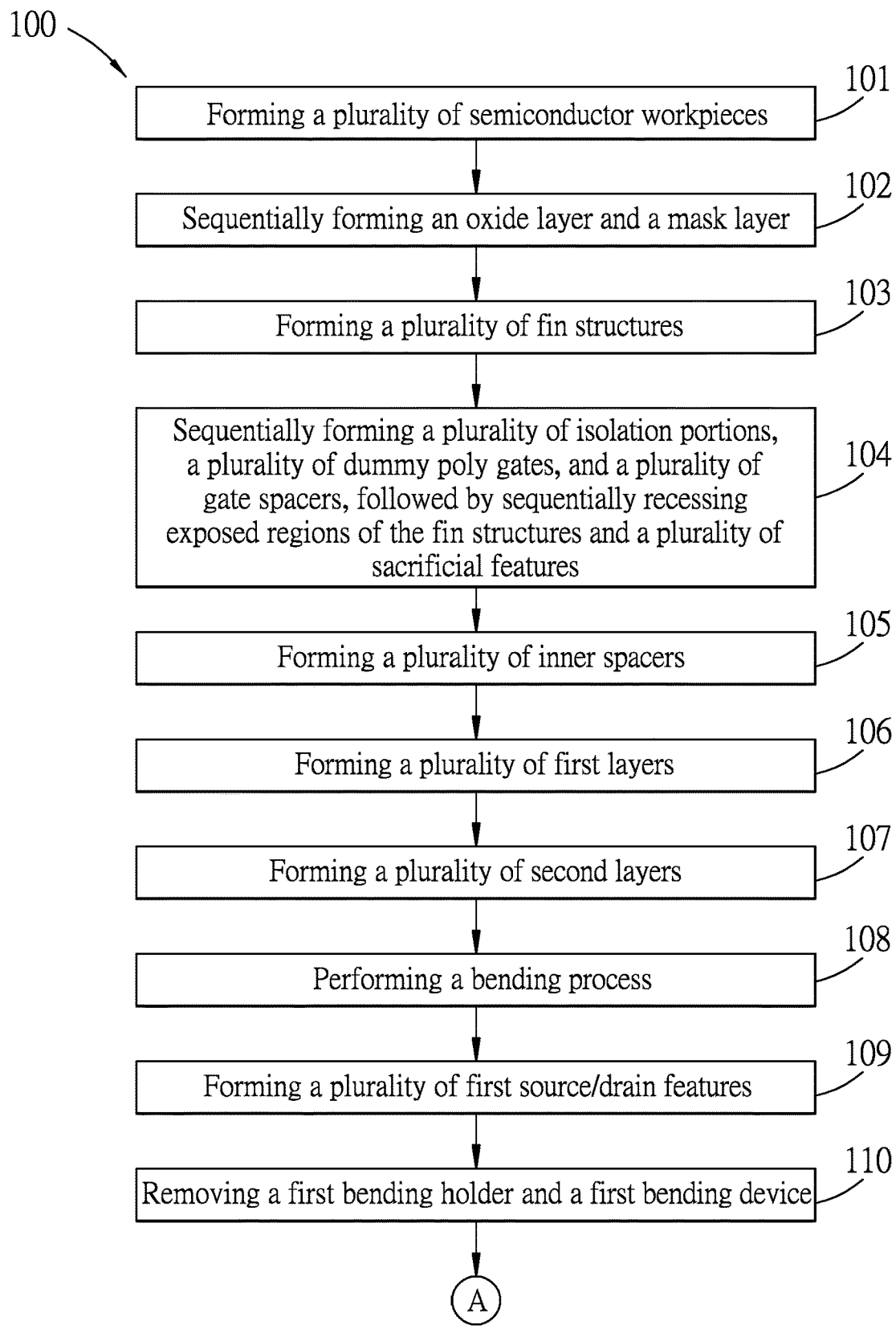
FIGS. 1A and 1B are flow diagrams illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "top," "bottom," "upper," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be noted that the element(s) or feature(s) are exaggeratedly shown in the figures for the purposed of convenient illustration and are not in scale.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

In a field-effect transistor (FET), such as a p-type FET or an n-type FET, source/drain features may induce a strain (e.g., compressive strain or tensile strain) in channel regions for enhancing hole or electron mobility in the channel regions. The compressive strain or tensile strain is used as a device performance booster, for example, to increase a drive current of the FET. In the p-type FET, the source/drain feature made of silicon germanium (SiGe) is usually formed on and strained by a silicon layer, and further induces a compressive strain in the channel region of the p-type FET to enhance the hole mobility in the channel region of the p-type FET. In the n-type FET, the source/drain feature made of silicon carbide (SiC) may induce a tensile strain in the channel region of the n-type FET for enhancing the electron mobility in the channel region of the n-type FET. Currently, in a structure of the p-type FET, a bottom dielectric isolation (BDI) is disposed between the silicon layer and a corresponding one of the source/drain features, and is used to shut-off a leakage path between the source/drain features when a gate of the p-type FET is turned off. However, when the BDI is disposed between the silicon layer and the corresponding one of the source/drain features of the p-type FET, the source/drain feature would not be strained by the silicon layer to further induce the compressive strain in the channel region of the p-type FET, and therefore the hole mobility in the channel region of the p-type FET may not be enhanced. On the other hand, enhancement of the electron mobility in the channel regions of the n-type FET is restricted because the source/drain features may not induce an increased tensile strain in the channel regions of the n-type FET.

Figure 1B:
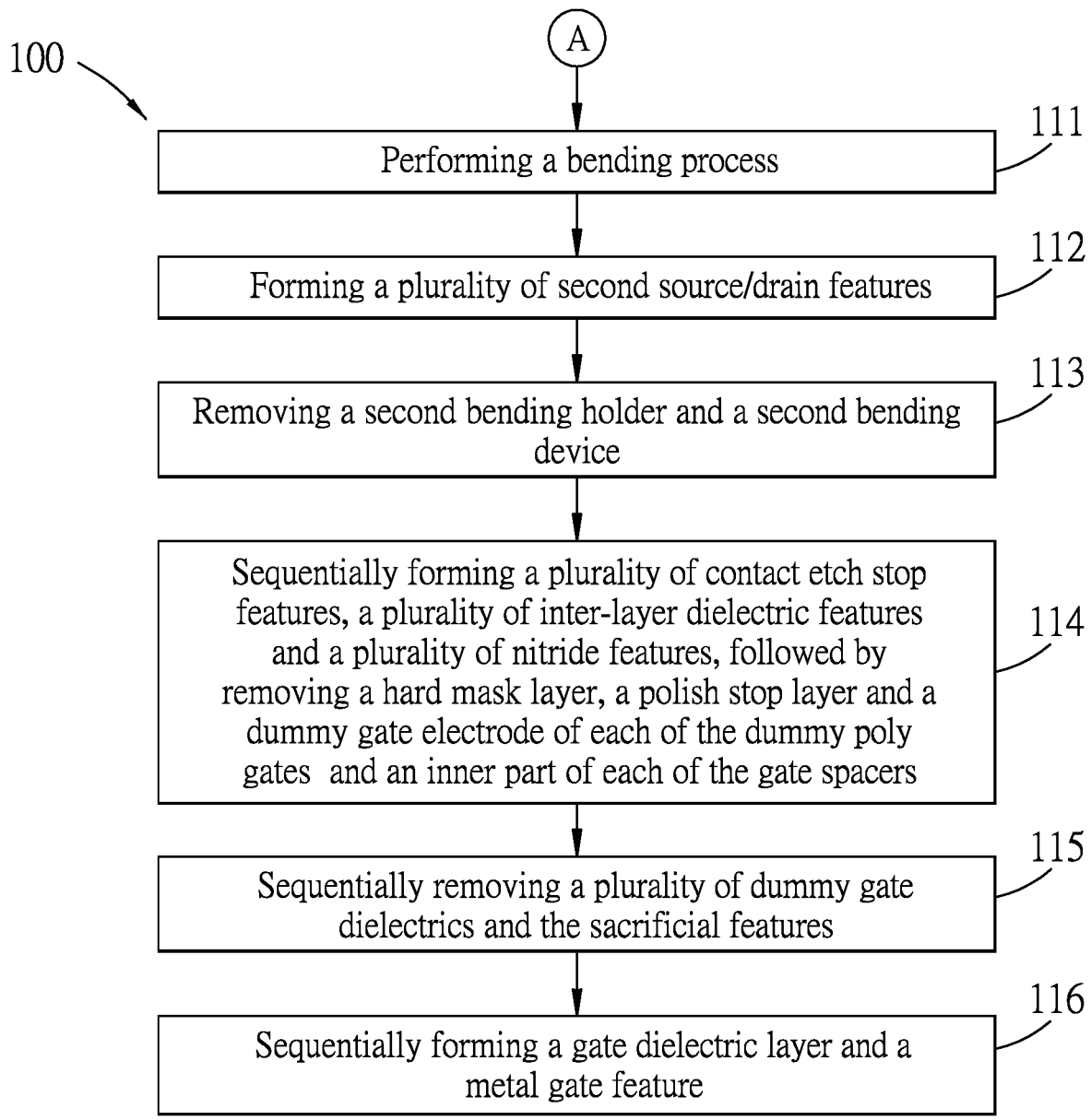

The present disclosure is directed to a semiconductor device and a method for manufacturing the same. FIGS. 1A and 1B are flow diagrams illustrating a method 100 for manufacturing a semiconductor device (for example, a p-type metal-oxide-semiconductor FET (PMOSFET) 30P or an n-type metal-oxide-semiconductor FET (NMOSFET) 30N shown in FIG. 18) in accordance with some embodiments. FIGS. 2A to 18 illustrate schematic views of some intermediate stages of the method 100. Some portions may be omitted in FIGS. 2A to 18 for the sake of brevity. Additional steps can be provided before, after or during the method 100, and some of the steps described herein may be replaced by other steps or be eliminated. It should be noted that although the method 100 is exemplified by a method for manufacturing a nanosheet gate-all-around (GAA) semiconductor device, the method 100 may be used for manufacturing other suitable semiconductor devices, such as FinFETs or planer MOSFETs.

Figure 2A:
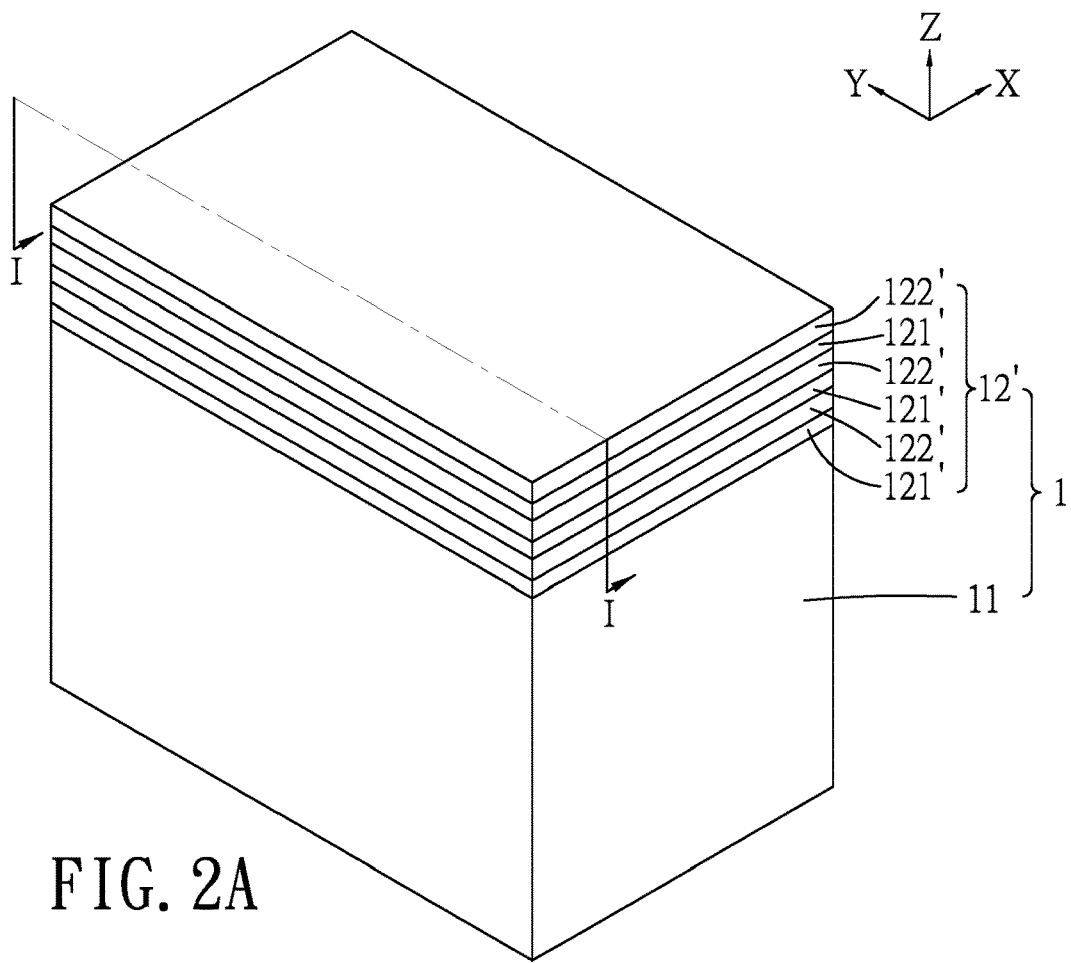
FIGS. 2A, 2B, 3A, 3B, 4A, 4B, 5A, 5B, 6-11, 12A, 12B, 13-14, 15A, 15B, 16A, 16B, 17A, 17B, and 18 are schematic views illustrating some intermediate stages of the method as depicted in FIGS. 1A and 1B in accordance with some embodiments.
Figure 2B:
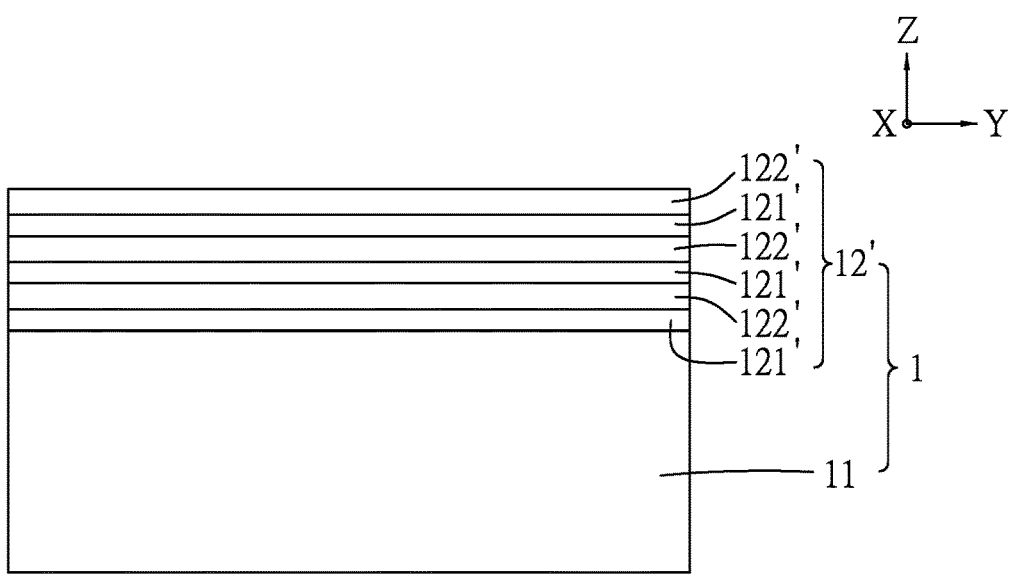

Referring to FIG. 1A and the example illustrated in FIGS. 2A and 2B, the method 100 begins at step 101, where a plurality of semiconductor workpieces 1 are formed. FIG. 2B illustrates a cross-sectional view taken along line I-I of FIG. 2A. One of the semiconductor workpieces 1 is shown in FIG. 2A. Step 101 may include sub-step (i) forming a nanosheet stack (not shown) over a semiconductor substrate 11, and sub-step (ii) etching portions of the nanosheet stack so as to form the semiconductor workpieces 1. In some embodiments, the semiconductor substrate 11 may include, but are not limited to, an elemental semiconductor or a compound semiconductor. The elemental semiconductor includes a single species of atoms, such as silicon (Si) or germanium (Ge) from column XIV of the periodic table, and may be crystalline, polycrystalline, or amorphous in structure. Other suitable materials for the elemental semiconductor are within the contemplated scope of the present disclosure. The compound semiconductor includes two or more elements, and examples thereof may include, but are not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials for the compound semiconductor are within the contemplated scope of the present disclosure. The compound semiconductor may have a gradient feature in which the compositional ratio thereof changes from one location to another location in the compound semiconductor. The compound semiconductor may be formed over a silicon substrate and may be strained. In some embodiments, the semiconductor substrate 11 may include a multilayer compound semiconductor structure. In some embodiments, the semiconductor substrate 11 may be a semiconductor wafer having a diameter of about 300 mm. Other diameter values of the semiconductor substrate 11 are within the contemplated scope of the present disclosure. In some embodiments, the nanosheet stack includes a plurality of sacrificial layers (not shown) and a plurality of channel layers (not shown) which are alternately stacked on the semiconductor substrate 11. In some embodiments, the sacrificial layers may include silicon germanium (SiGe). Other suitable materials for the sacrificial layers are within the contemplated scope of the present disclosure. In some embodiments, the channel layers may include silicon (Si). Other suitable materials for the channel layers are within the contemplated scope of the present disclosure. The sacrificial layers and the channel layers may be formed by a suitable deposition process, for example, but are not limited to, chemical vapor deposition (CVD) (e.g., ultra-high vacuum CVD (UHV-CVD)) or other suitable deposition processes. In some embodiments, the sacrificial layers and the channel layers may be formed by a suitable epitaxial process, for example, but not limited to, molecular beam epitaxy (MBE) or other suitable epitaxial processes. In some embodiments, the semiconductor workpieces 1 are spaced apart from each other in an X direction or a Y direction transverse to the X direction. In some embodiments, each of the semiconductor workpieces 1 includes a portion of the semiconductor substrate 11 and a semiconductor stack 12' disposed on the portion of the semiconductor substrate 11 in a Z direction transverse to the X and Y directions. In some embodiments, the semiconductor stack 12' includes a plurality of sacrificial layer portions 121' which are parts of the sacrificial layers of the nanosheet stack, and a plurality of channel layer portions 122' which are parts of the channel layers of the nanosheet stack, where the sacrificial layer portions 121' and the channel layer portions 122' are alternately stacked over one another along the Z direction.

Figure 3A:
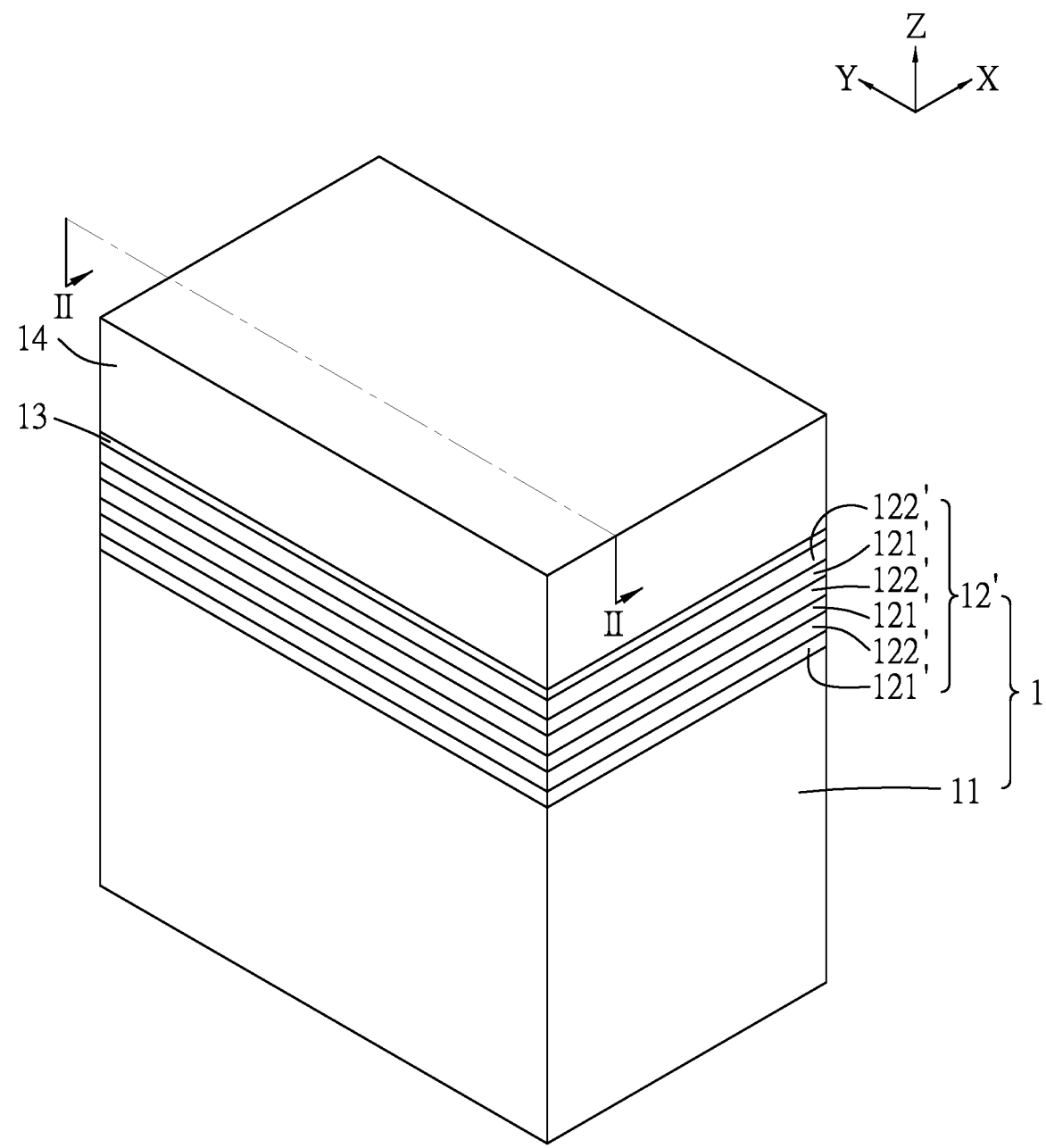
Figure 3B:
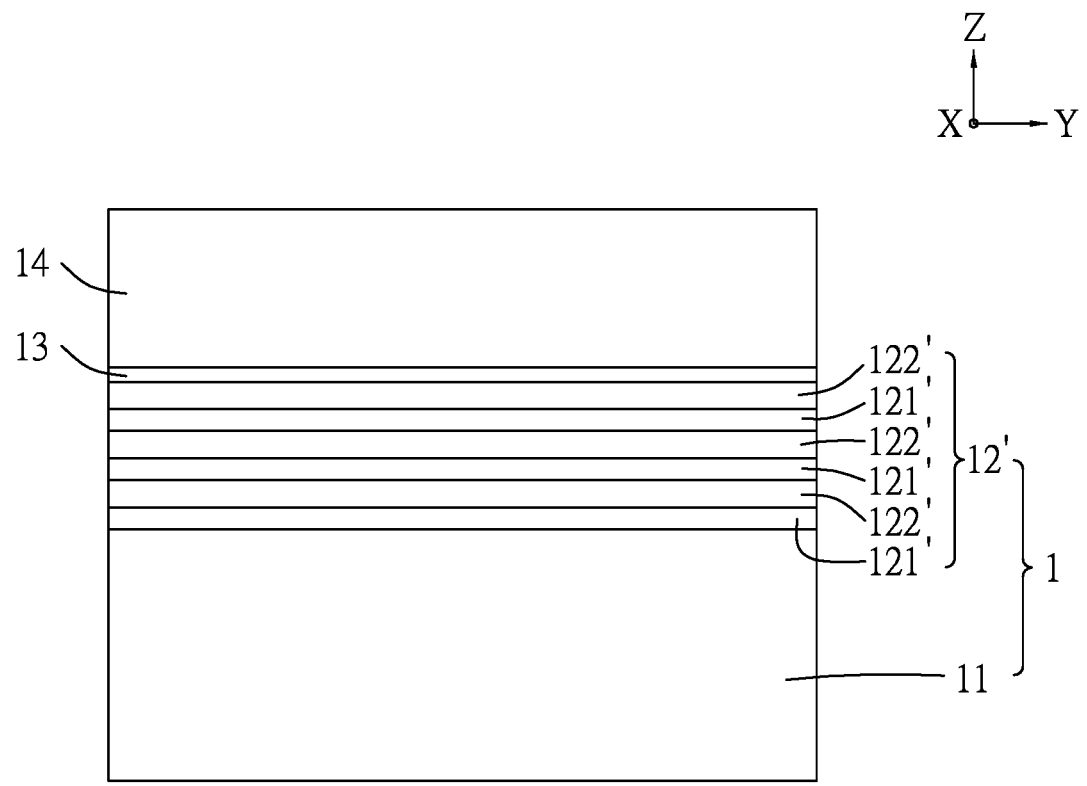

Referring to FIG. 1A and the example illustrated in FIGS. 3A and 3B, the method 100 then proceeds to step 102, where an oxide layer 13 and a mask layer 14 are sequentially formed on each of the semiconductor workpieces 1. FIG. 3B illustrates a cross-sectional view taken along line II-II of FIG. 3A. The oxide layer 13 may include silicon oxide. Other suitable materials for the oxide layer 13 are within the contemplated scope of the present disclosure. The oxide layer 13 may be formed by a suitable deposition process, for example, but not limited to, CVD, atomic layer deposition (ALD), or other suitable deposition processes. The mask layer 14 may be made of a nitride-based material (for example, silicon nitride). Other suitable materials for the mask layer 14 are within the contemplated scope of the present disclosure. The mask layer 14 may be formed by a suitable deposition process, for example, but not limited to, CVD (e.g., plasma-enhanced CVD (PECVD)). ALD (e.g., plasma-enhanced ALD (PEALD)), or other suitable deposition processes.

Figure 4A:
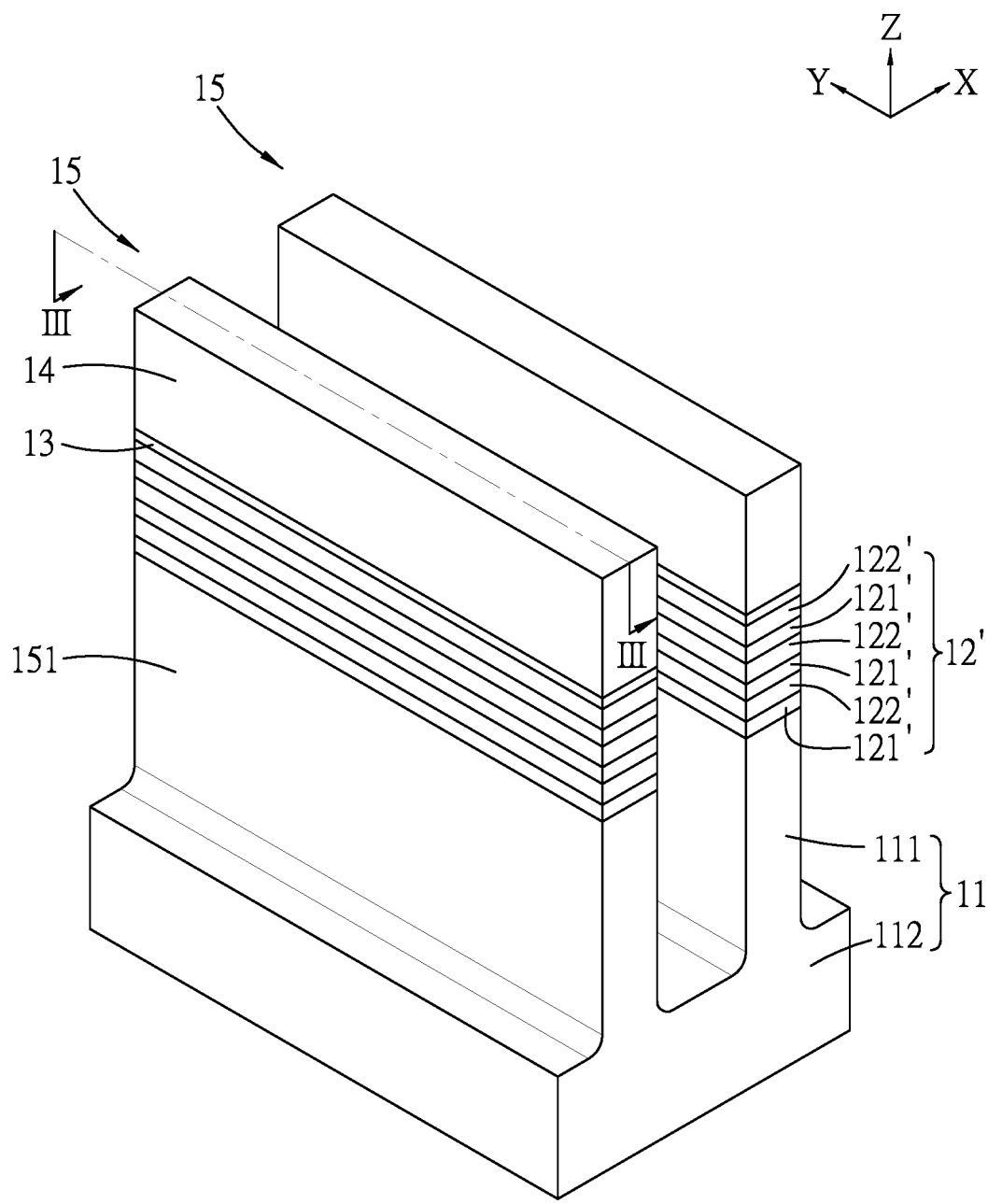
Figure 4B:
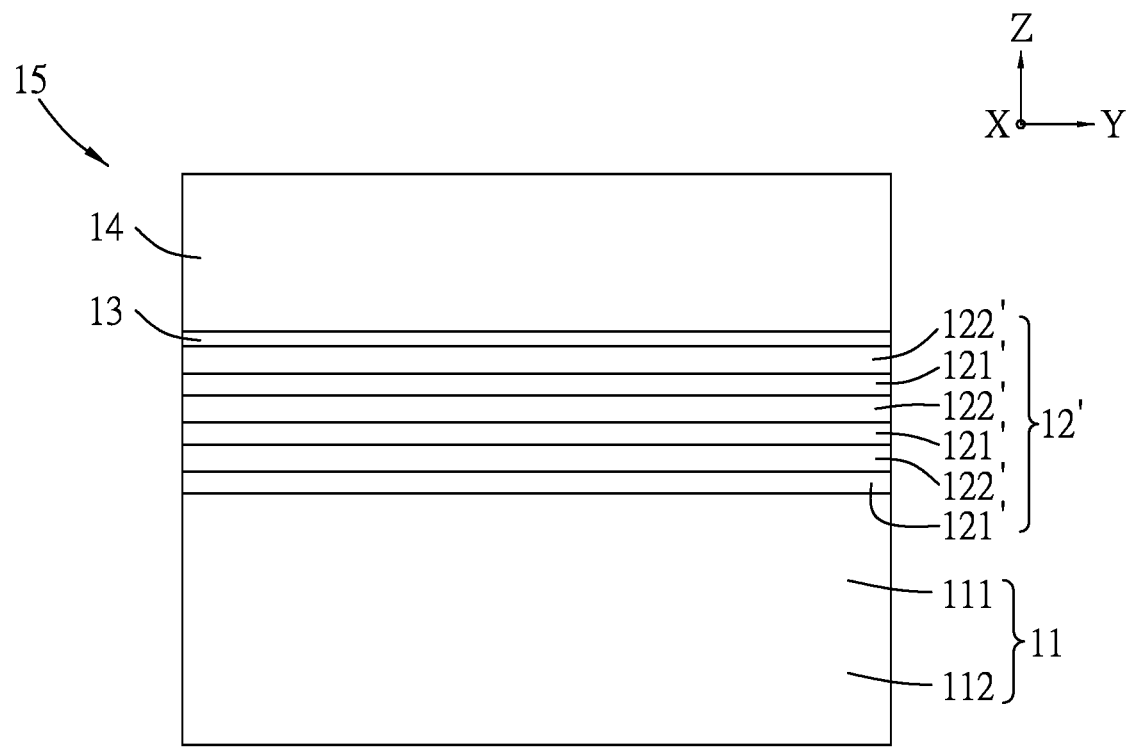

Referring to FIG. 1A and the example illustrated in FIGS. 4A and 4B, the method 100 then proceeds to step 103, where the structure shown in FIG. 3A (or FIG. 3B) is patterned to form a plurality of fin structures 15 that are spaced apart from each other by trenches in the X direction. FIG. 4B illustrates a cross-sectional view taken along line III-III of FIG. 4A. Step 103 may be performed by a photolithography process, which includes an etching process. The etching process may be performed using, for example, but not limited to, an anisotropically etching process (for example, dry etching or other suitable anisotropically etching processes). Each of the trenches may penetrate through the mask layer 14, the oxide layer 13, the semiconductor stack 12' and an upper portion 111 of the semiconductor substrate 11, and terminate at a lower portion 112 of the semiconductor substrate 11. In some embodiments, an upper surface of each of the fin structures 15 may have a plurality of covering regions 15a (see FIG. 5B) and a plurality of exposed regions (not shown) that are separated from one another in the Y direction.

Figure 5A:
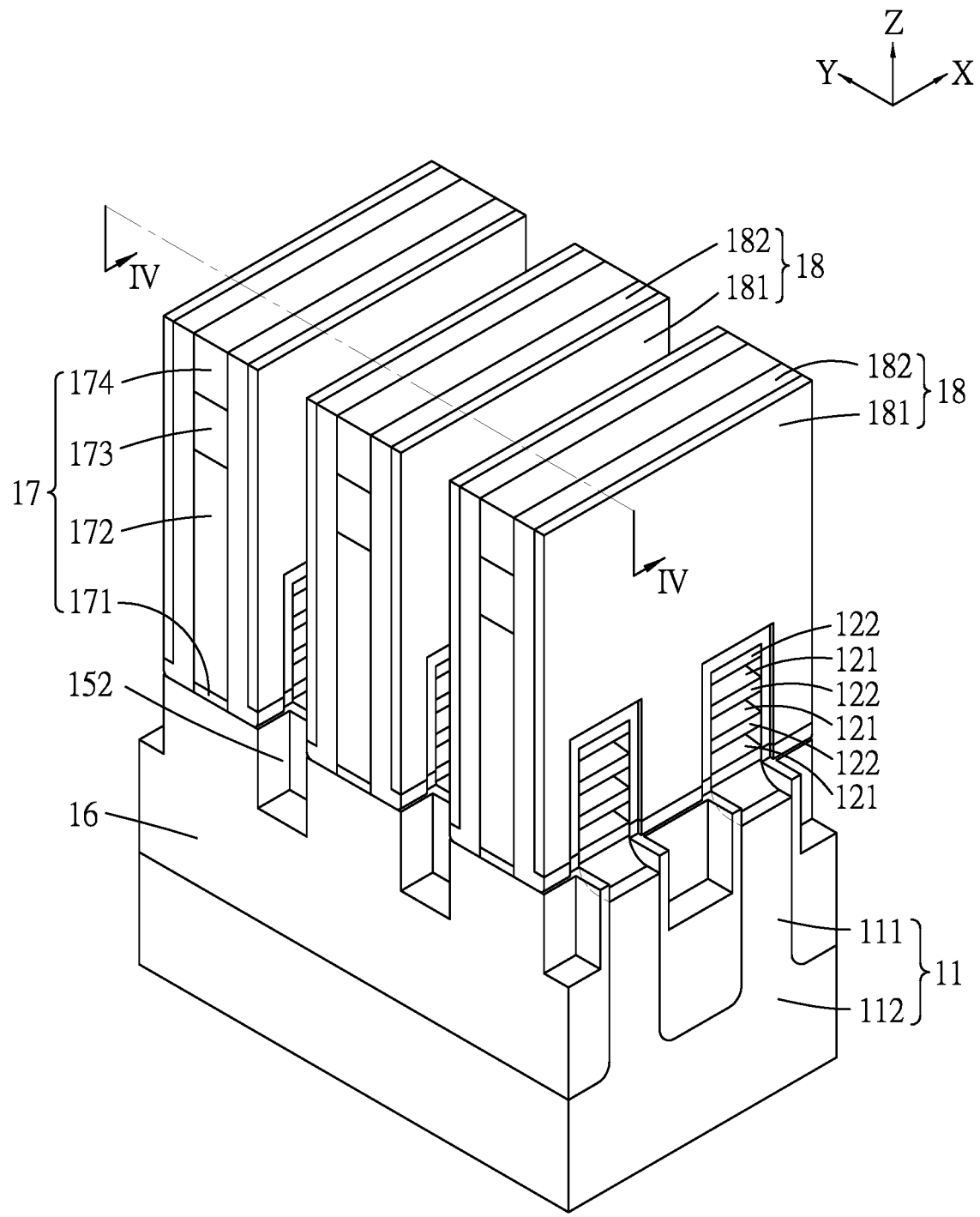
Figure 5B:
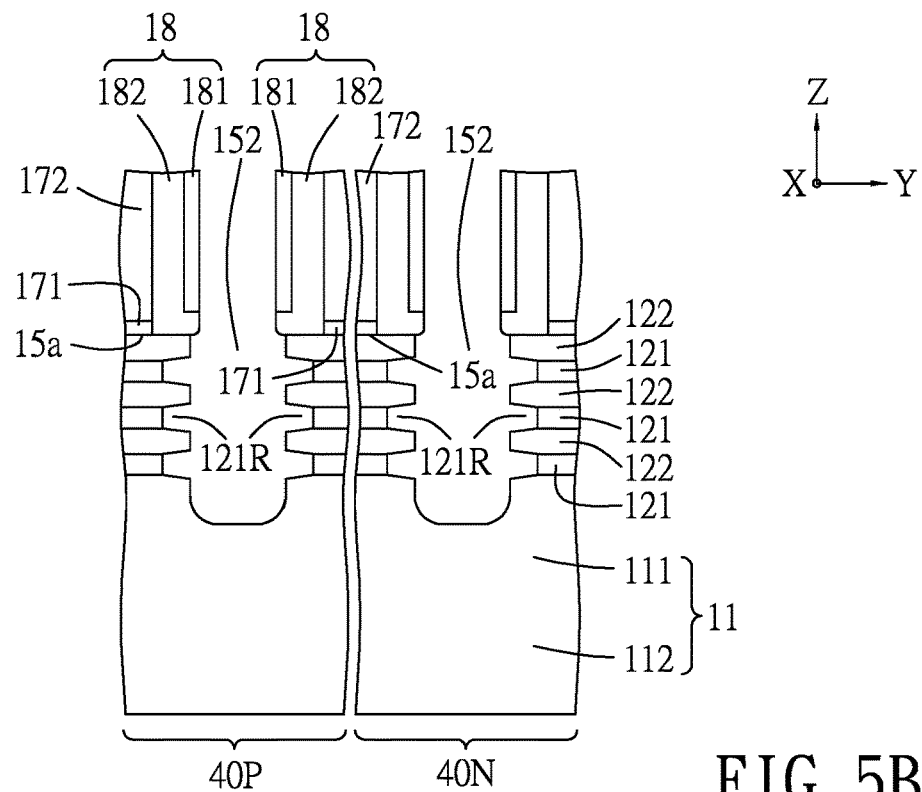

Referring to FIG. 1A and the example illustrated in FIGS. 5A and 5B, the method 100 then proceeds to step 104, where a plurality of isolation portions 16, a plurality of dummy poly gates 17 and a plurality of gate spacers 18 are sequentially formed on the structure shown in FIG. 4A (or FIG. 4B), followed by sequentially recessing the exposed regions of the fin structures 15 and sacrificial features 121. FIG. 5B illustrates a fragmentary cross-sectional view taken along line IV-IV of FIG. 5A. Step 104 may include sub-steps 1041 to 1045.

In sub-step 1041, the isolation portions 16 are formed on the semiconductor substrate 11. Two of the isolation portions 16 are located at two opposite sides of a lower fin portion 151 of each of the fin structures 15 which are opposite to each other in the X direction (see FIG. 4A), so as to separate and isolate the fin structures 15 from each other. In some embodiments, the isolation portions 16 may be made of an oxide-based material (e.g., silicon oxide), a nitride-based material (e.g., silicon nitride), or a combination thereof. Other suitable materials for the isolation portions 16 are within the contemplated scope of the present disclosure. In some embodiments, the isolation portions 16 may be formed by a suitable deposition process, for example, but not limited to, CVD, physical vapor deposition (PVD), or other suitable deposition processes. In some embodiments, each of the isolation portions 16 may be a portion of a shallow trench isolation (STI), a deep trench isolation (DTI), or other suitable structures.

In sub-step 1042, the dummy poly gates 17 are formed on the isolation portions 16 and over the fin structures 15, and are spaced apart from each other in the Y direction. In some embodiments, each of the dummy poly gates 17 may include a dummy gate dielectric 171, a dummy gate electrode 172, a polish stop layer 173, and a hard mask layer 174.

The dummy gate dielectric 171 of each of the dummy poly gates 17 is disposed on a corresponding one of the covering regions 15a of each of the fin structures 15. The dummy gate dielectric 171 may be made of an oxide-based material (e.g., silicon oxide). Other suitable materials for the dummy gate dielectric 171 are within the contemplated scope of the present disclosure.

The dummy gate electrode 172 is disposed on the dummy gate dielectric 171. The dummy gate electrode 172 may include polysilicon. Other suitable materials for the dummy gate electrode 172 are within the contemplated scope of the present disclosure.

The polish stop layer 173 is disposed on the dummy gate electrode 172 opposite to the dummy gate dielectric 171. The polish stop layer 173 may include silicon nitride, silicon oxide, silicon oxynitride, or combinations thereof. Other suitable materials for the polish stop layer 173 are within the contemplated scope of the present disclosure.

The hard mask layer 174 is disposed on the polish stop layer 173 opposite to the dummy gate electrode 172. The hard mask layer 174 may include silicon nitride, silicon oxide, silicon oxynitride, or combinations thereof. Other suitable materials for the hard mask layer 174 are within the contemplated scope of the present disclosure.

In sub-step 1043, each pair of the gate spacers 18 are respectively formed at two opposite sides of a corresponding one of the dummy poly gates 17 in the Y direction. In some embodiments, each of the gate spacers 18 may be formed as a single layer structure or a multi-layered structure. In some embodiments, when each of the gate spacers 18 is formed as a multi-layered structure, each of the gate spacers 18 may include an outer part 181 and an inner part 182 disposed between a corresponding one of the dummy poly gates 17 and the outer part 181. Sub-step 1043 may be performed by sequentially depositing two spacer material layers on the dummy poly gates 17 and the exposed regions of the fin structures 15 by a suitable deposition process, for example, but not limited to, CVD, ALD, or other suitable deposition processes, followed by an anisotropic dry etching process until portions of the spacer material layers, which are respectively formed on the exposed regions of the fin structures 15 and an upper surface of each of the dummy poly gates 17, are removed such that remaining portions of the spacer material layers serve as the gate spacers 18. The spacer material layers for the gate spacers 18 may include, for example, but not limited to, silicon oxide, silicon nitride, silicon oxynitride, silicon carbon nitride, silicon oxycarbonnitride, or low dielectric constant (k) materials. Other suitable materials for the gate spacers 18 are within the contemplated scope of the present disclosure.

In sub-step 1044, the exposed regions of the fin structures 15 are recessed by a suitable etching process, for example, but not limited to, dry etching, wet etching, other suitable etching processes, or combinations thereof, so as to form a plurality of source/drain trenches 152 that are spaced apart from each other in the Y direction. After sub-step 1044, the sacrificial layer portions 121' and the channel layer portions 122' (see FIGS. 4A and 4B) are respectively patterned into the sacrificial features 121 and channel features 122.

In sub-step 1045, the sacrificial features 121 are laterally recessed by an isotropic etching process, for example, but not limited to, wet etching process or other suitable etching processes to remove side portions of the sacrificial features 121 based on a relatively high etching selectivity of the sacrificial features 121 with respect to the channel features 122, so as to form a plurality of lateral recesses 121R (see FIG. 5B).

After step 104, the semiconductor substrate 11 may be divided into an n-type FET (n-FET) region 40N and a p-type FET (p-FET) region 40P (see FIG. 5B) for the NMOSFET 30N and the PMOSFET 30P (see FIG. 18) to be subsequently and respectively formed thereon.

Figure 6:
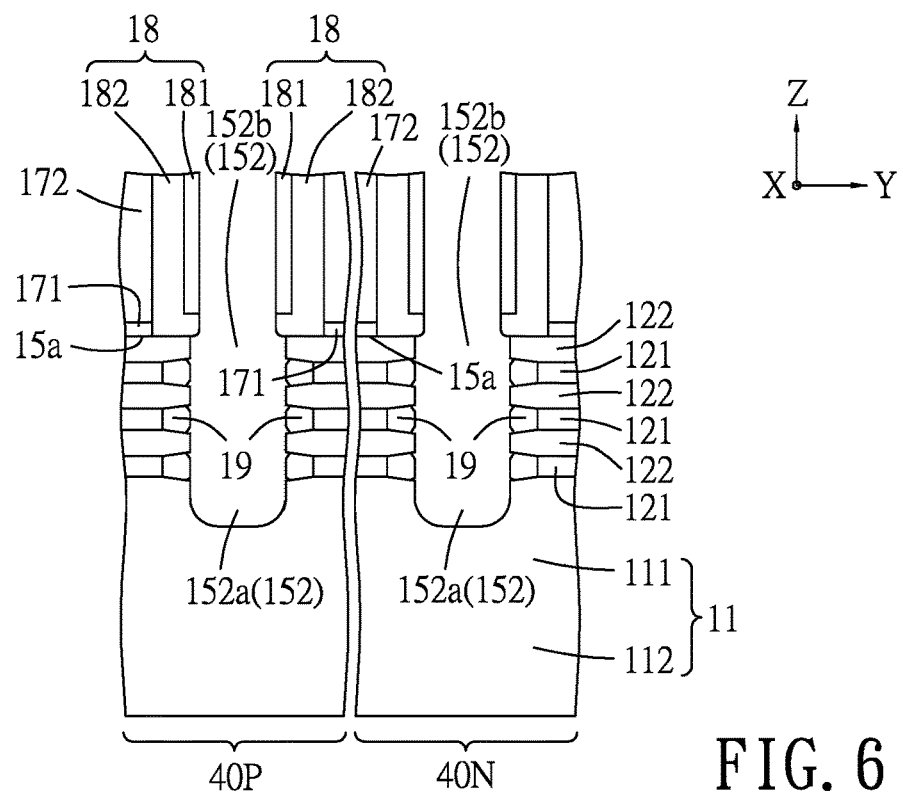

Referring to FIG. 1A and the example illustrated in FIG. 6, the method 100 then proceeds to step 105, where a plurality of inner spacers 19 are formed in the lateral recesses 121R (see FIG. 5B). Step 105 may be performed by conformally depositing an inner spacer material layer (not shown) over the structure shown in FIG. 5B to fill the lateral recesses 121R, followed by isotropically etching the inner spacer material layer to form the inner spacers 19 in the lateral recesses 121R so as to laterally cover the sacrificial features 121. The inner spacer material layer may be formed by a suitable deposition process, for example, but not limited to, CVD, PECVD, PVD, ALD, PEALD, or other suitable deposition processes. The inner spacer material layer may include, for example, but not limited to, silicon oxide, silicon nitride, silicon oxycarbide, silicon oxynitride, silicon carbon nitride, silicon oxycarbonitride, low k materials, or combinations thereof. Other suitable materials for the inner spacers 19 are within the contemplated scope of the present disclosure. The isotropic etching process may be a dry isotropic etching process, a wet isotropic etching process, or a combination thereof.

Figure 7:
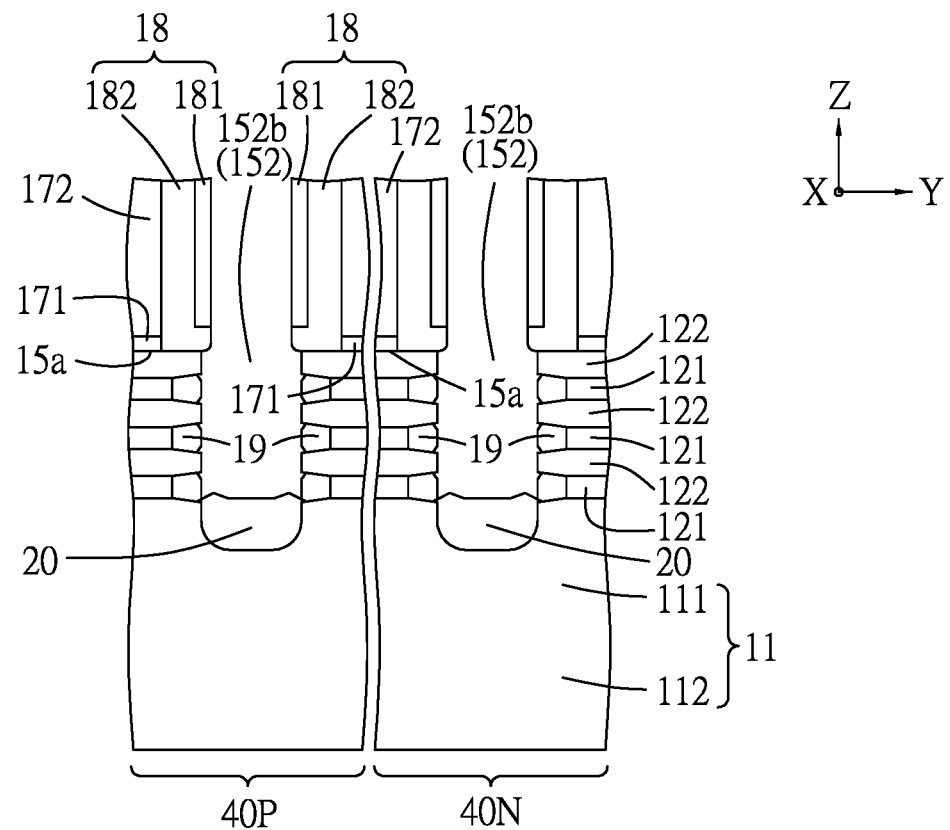

Referring to FIG. 1A and the example illustrated in FIG. 7, the method 100 then proceeds to step 106, where a plurality of first layers 20 are respectively formed in lower trench portions 152a (see FIG. 6) of the source/drain trenches 152 at the n-FET and p-FET regions 40N, 40P. In some embodiments, the first layers 20 may be made of a semiconductor material, for example, but not limited to, silicon (Si). In some embodiments, the first layers 20 may be formed by, for example, but not limited to, a deposition process (e.g., CVD), an epitaxial growth process (e.g., (MBE)), an epitaxial deposition/partial etch process (e.g., cyclic deposition-etch (CDE) process), or a selective epitaxial growth (SEG) process.

Figure 8:
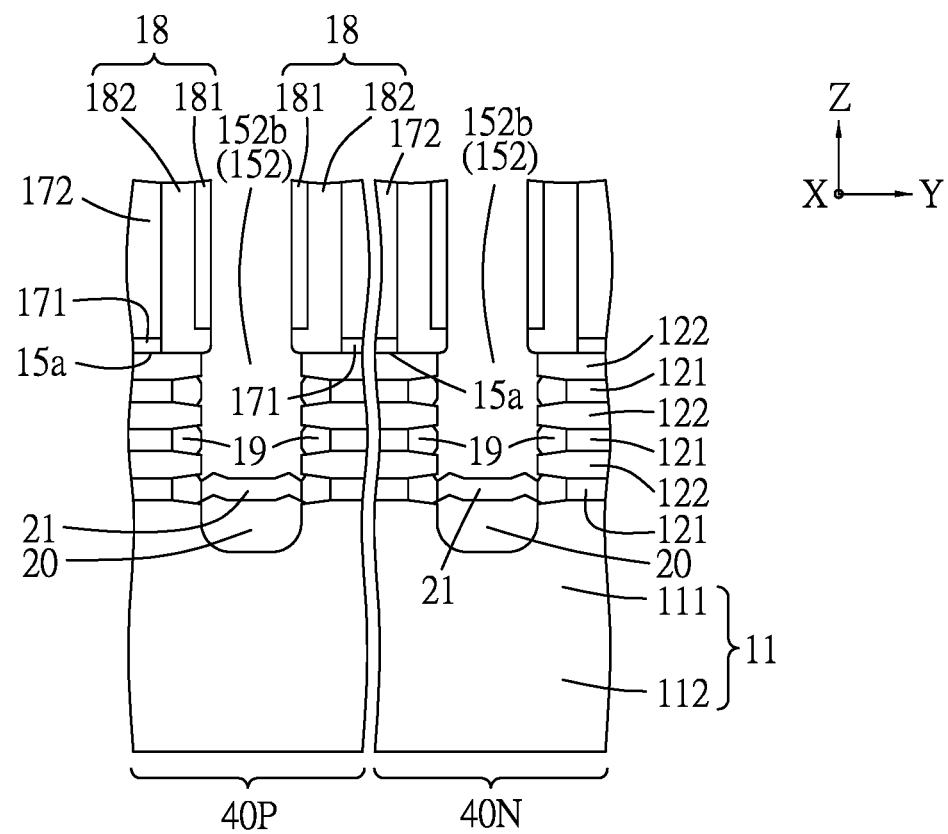

Referring to FIG. 1A and the example illustrated in FIG. 8, the method 100 then proceeds to step 107, where a plurality of second layers 21 are respectively formed on the first layers 20 in the source/drain trenches 152. Step 107 may include sub-step (i) depositing a dielectric material layer for forming the second layers 21 on the structure shown in FIG. 7 by a suitable deposition process, for example, but not limited to, CVD, ALD, or other suitable deposition processes; and sub-step (ii) removing excess portions of the dielectric material layer for forming the second layers 21 by a suitable etching process, for example, but not limited to, wet etching, dry etching, other suitable etching processes, or combinations thereof, such that remaining portions of the dielectric material layer serve as the second layers 21 which are respectively formed on the first layers 20 in the source/drain trenches 152. The dielectric material layer for forming the second layers 21 may be made of an amorphous material, for example, but not limited to, SiOx or SiNx. Other suitable materials for forming the second layers 21 are within the contemplated scope of the present disclosure. In some embodiments, the second layers 21 may be referred to as bottom dielectric isolations (BDIs), and may be used to shut-off a leakage path between two of first source/drain features 22 or between two of second source/drain features 23 (which will be described hereinafter) when a gate structure of the PMOSFET 30P or the NMOSFET 30N (see FIG. 18) is turned off.

Figure 9:
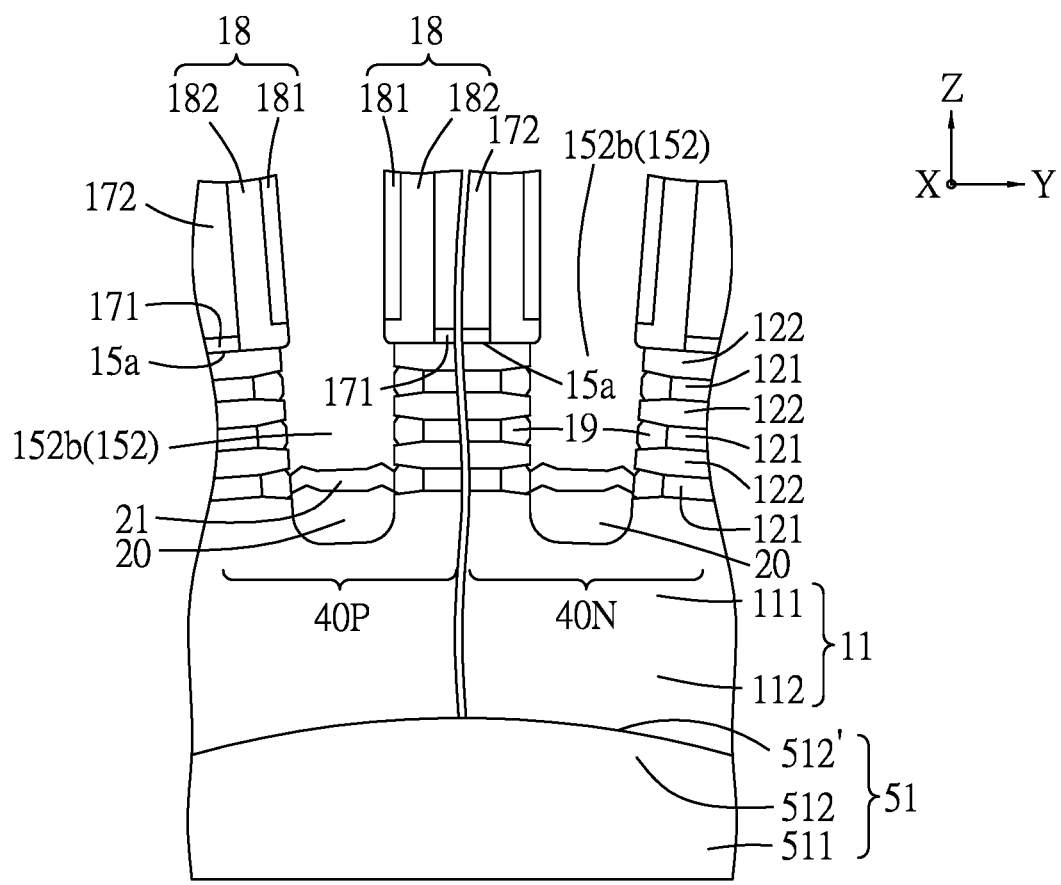

Referring to FIG. 1A and the example illustrated in FIG. 9, the method 100 then proceeds to step 108, where the structure shown in FIG. 8 is bent downwardly. Step 108 may be performed by bending downwardly the structure shown in FIG. 8 through a first bending holder (not shown) and a first bending device 51. In step 108, the structure shown in FIG. 8 is transformed from a flat state to a first bending state. In some embodiments, the first bending holder may be a clip for clipping the structure shown in FIG. 8 on the first bending device 51. In some embodiments, the first bending holder may be made of a metal or a ceramic material. Other suitable materials for the first bending holder are within the contemplated scope of the present disclosure. In some embodiments, the first bending holder may have a round shape. In some embodiments, the first bending device 51 may include a base portion 511 and an upper portion 512 that has a curved upper surface 512' in contact with a lower surface of the semiconductor substrate 11. In some embodiments, the curved upper surface 512' of the upper portion 512 of the first bending device 51 may be a semi-cylindrical convex surface having a radius of curvature that ranges from about 5 m to about 500 m. In some embodiments, the structure shown in FIG. 8 is bent downwardly to have a semi-cylindrical shape through the first bending holder and the first bending device 51. In step 108, size of upper trench portions 152b of the source/drain trenches 152 may be enlarged.

Figure 10:
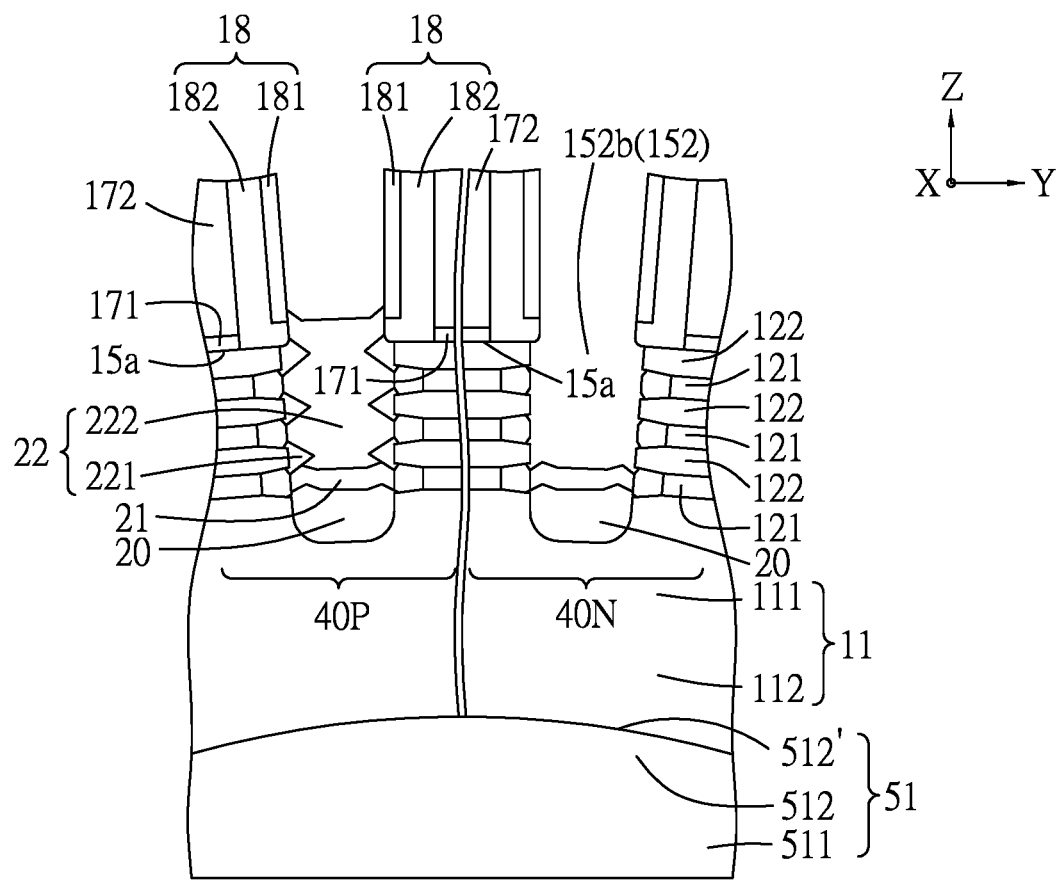

Referring to FIG. 1A and the example illustrated in FIG. 10, the method 100 then proceeds to step 109, where a plurality of the first source/drain features 22 are respectively formed on the second layers 21 in the upper trench portions 152b of the source/drain trenches 152 at the p-FET region 40P. The first layers 20, the second layers 21, and the first source/drain features 22 together serve as first source/drain regions. At the p-FET region 40P, each of the first source/drain features 22 has a p-type conductivity. In some embodiments, each of the first source/drain features 22 includes a plurality of first outer regions 221 and a first major region 222, and each of the first outer regions 221 is disposed between a corresponding one of the channel features 122 and the first major region 222. Step 109 may be performed by sequentially forming the first outer regions 221 and the first major region 222 in the upper trench portions 152b of the source/drain trenches 152 at the p-FET region 40P using an epitaxial growth technique. In some embodiments, the first outer regions 221 may serve as seeding layers for forming the first major region 222. In some embodiments in which the channel features 122 are made of silicon (Si), both of the first outer regions 221 and the first major region 222 may be made of silicon (Si) so as to provide a better epitaxial growth performance. In some embodiments, the first outer regions 221 may be made of silicon (Si) and the first major region 222 may be made of silicon germanium (SiGe). In some embodiments, each of the first source/drain features 22 may not be strained by a corresponding one of the first layers 20 (e.g., made of silicon (Si)) due to a corresponding one of the second layers 21 disposed therebetween.

Figure 11:
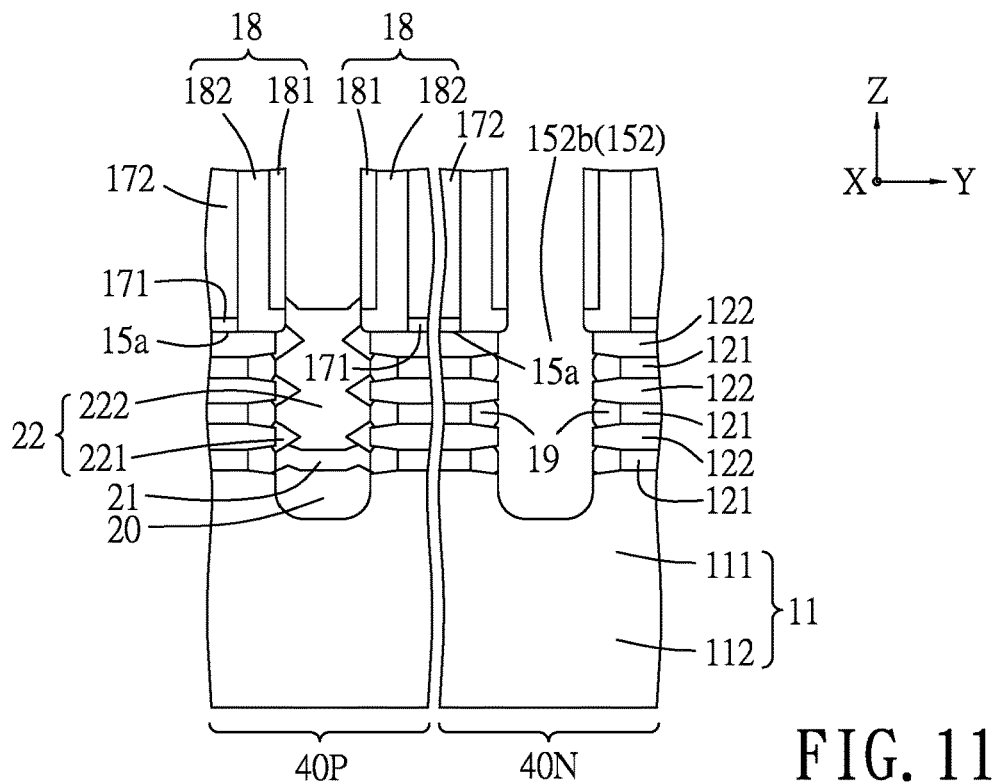

Referring to FIG. 1A and the example illustrated in FIG. 11, the method 100 then proceeds to step 110, where the first bending holder is detached and the structure shown in FIG. 10 is removed from the first bending device 51, such that the structure shown in FIG. 10 is reverted from the first bending state back to the flat state, and the channel features 122 at the p-FET region 40P may undergo a compressive strain ranging from about 0.1 GPa to about 5 GPa, which is capable of enhancing hole mobility in the channel features 122 at the p-FET region 40P. Therefore, as described above, in addition to SiGe, which is currently used for forming the source/drain features of the p-type FET so as to induce the compressive strain in the channel regions of the p-type FET, silicon (Si) may be alternatively used to form the first source/drain features 22 of the PMOSFET 30P, and the compressive strain in the channel features 122 can also be induced after the structure shown in FIG. 10 is reverted from the first bending state back to the flat state.

In some embodiments, when the structure shown in FIG. 8 is bent downwardly (i.e., step 108 shown in FIG. 1A), the structure shown in FIG. 8 may have a radius of curvature ranging from about 5 m to about 500 m. If the radius of curvature of the structure shown in FIG. 8 is smaller than about 5 m, the structure shown in FIG. 8 may be broken due to over-bending thereof. If the radius of curvature of the structure shown in FIG. 8 is greater than about 500 m, the compressive strain may be not induced after the structure shown in FIG. 10 is reverted from the first bending state back to the flat state, and thus, the hole mobility of the channel features 122 at the p-FET region 40P may not be efficiently enhanced. In some embodiments, when the structure shown in FIG. 8 is bent downwardly (i.e., in the first bending state), the radius of curvature thereof may range from about 850 m to about 17 m, and a center point of the lower surface of the semiconductor substrate 11 may have a raised height ranging from about 0.1 mm to about 2.7 mm which is measured from a top surface of the base portion 511 of the first bending device 51. In such case, the compressive strain ranging from about 0.1 GPa to about 5 GPa is induced in the channel features 122 at the p-FET region 40P after the structure shown in FIG. 10 is reverted from the first bending state back to the flat state.

In some embodiments, after formation of the second layers 21 (i.e., step 107 shown in FIG. 1A) and before formation of the first source/drain features 22 (i.e., step 109 shown in FIG. 1A), a first patterned hard mask (not shown) may be formed on the structure at the n-FET region 40N shown in FIG. 9 by the following sub-steps of: (i) depositing a hard mask layer (not shown) using a suitable deposition process, (ii) forming a photoresist layer (not shown) on the hard mask layer, (iii) performing a lithography process to pattern the photoresist layer, and (iv) etching the hard mask layer through the patterned photoresist layer to obtain the first patterned hard mask which protects the structure at the n-FET region 40N and which exposes the structure at the p-FET region 40P. In some embodiments, the first patterned hard mask may include a dielectric material (e.g., silicon oxide, silicon nitride, silicon oxynitride, or aluminum oxide), a bottom anti-reflective coating (BARC), or a combination thereof. In some embodiments, the patterned photoresist layer can be used to protect the n-FET region 40N and to expose the p-FET region 40P without using the first patterned hard mask. After the formation of the first source/drain features 22, the first patterned hard mask and/or the patterned photoresist layer is removed from the n-FET region 40N.

Figure 12A:
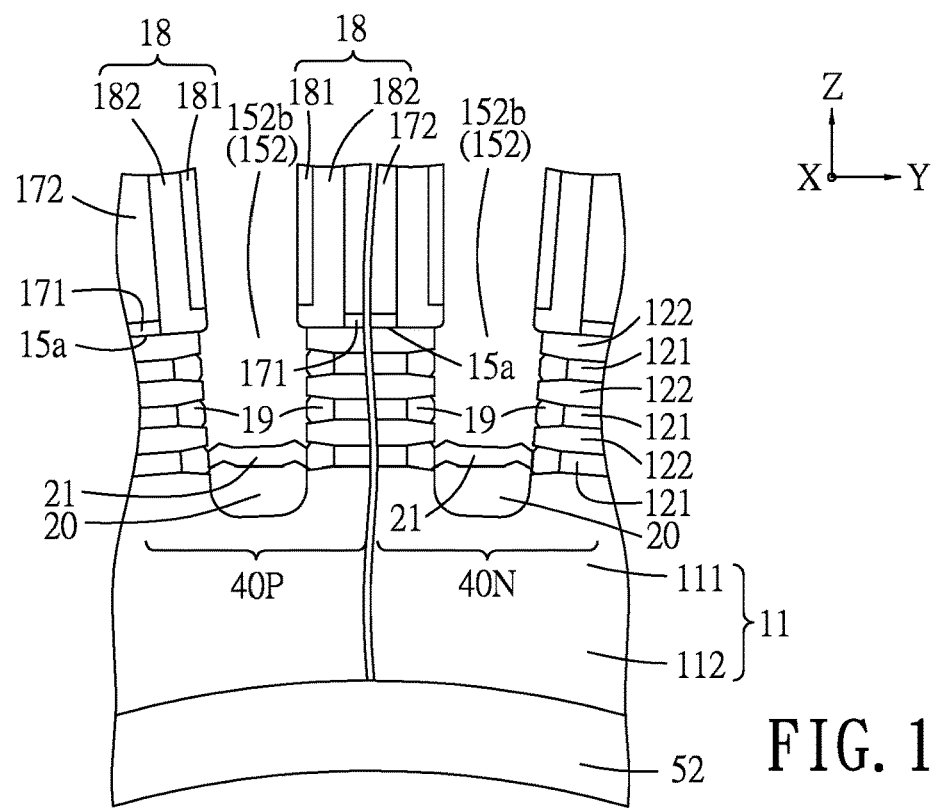

In some embodiments, as shown in FIG. 12A, the structure shown in FIG. 8 may be bent downwardly (i.e., step 108 shown in FIG. 1A) through a first thin film layer 52. The first thin film layer 52 is disposed on a backside of the semiconductor substrate 11, and is used to strain and bend the semiconductor substrate 11 downwardly. The first thin film layer 52 may be made of silicon carbon nitride (SiCN), silicon nitride (SiN), aluminum oxide (AlO), hafnium oxide ($H_fO$), titanium oxide (TiO), or silicon oxide (SiO). Other suitable materials for the first thin film layer 52 are within the contemplated scope of the present disclosure. The first thin film layer 52 may be formed by a suitable deposition process, for example, but not limited to, CVD, PVD, furnace growth process, or other suitable deposition processes. In some embodiments, the first thin film layer 52 may have a thickness ranging from about 1 nm to about 100 nm. After the formation of the first source/drain features 22 (i.e., step 109 shown in FIG. 1A), the first thin film layer 52 is removed by a suitable etching process, and the channel features 122 at the p-FET region 40P may undergo the compressive strain ranging from about 0.1 GPa to about 5 GPa, which is capable of enhancing the hole mobility in the channel features 122 at the p-FET region 40P. In some embodiments, after formation of the inner spacers 19 (i.e., step 105 shown in FIG. 1A) and before formation of the first layers 20 (i.e., step 106 shown in FIG. 1A), the first thin film layer 52 may be formed on the backside of the semiconductor substrate 11 of the structure shown in FIG. 6.

Figure 12B:
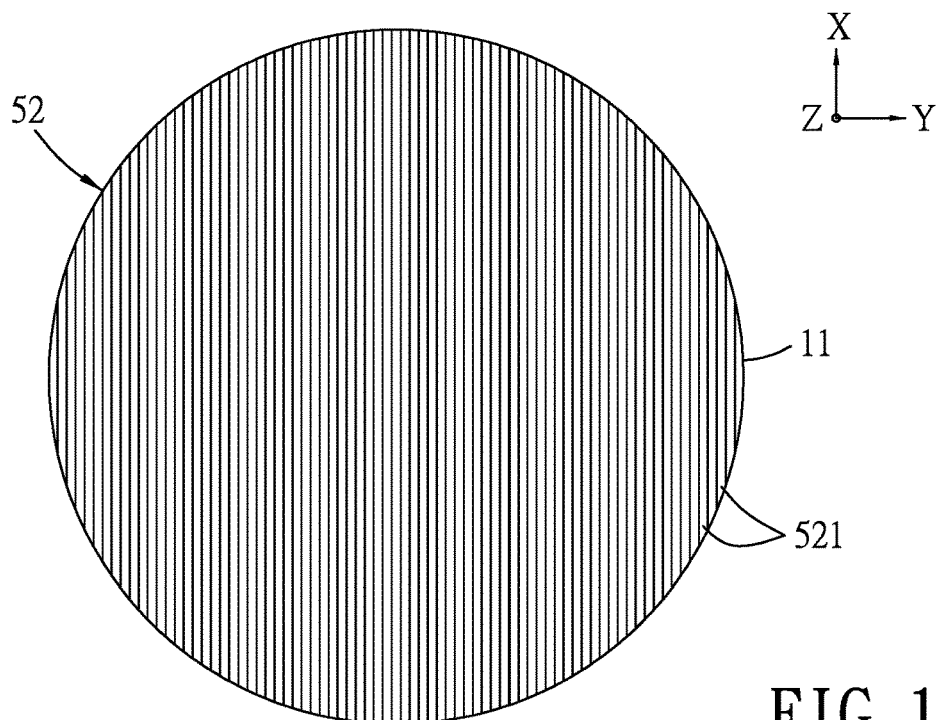

In some embodiments, as shown in FIG. 12B, the first thin film layer 52 may be formed as a plurality of strips 521 that are disposed on the backside of the semiconductor substrate 11 and that are spaced apart from each other. In some embodiments, the first thin film layer 52 may be etched by a suitable etching process, for example, but not limited to, dry etching, wet etching, other suitable etching processes, or combinations thereof, so as to form the strips 521. The strips 521 can be used to strain the semiconductor substrate 11 along one direction (e.g., the Y direction), so that the structure shown in FIG. 6 can be bent downwardly.

Figure 13:
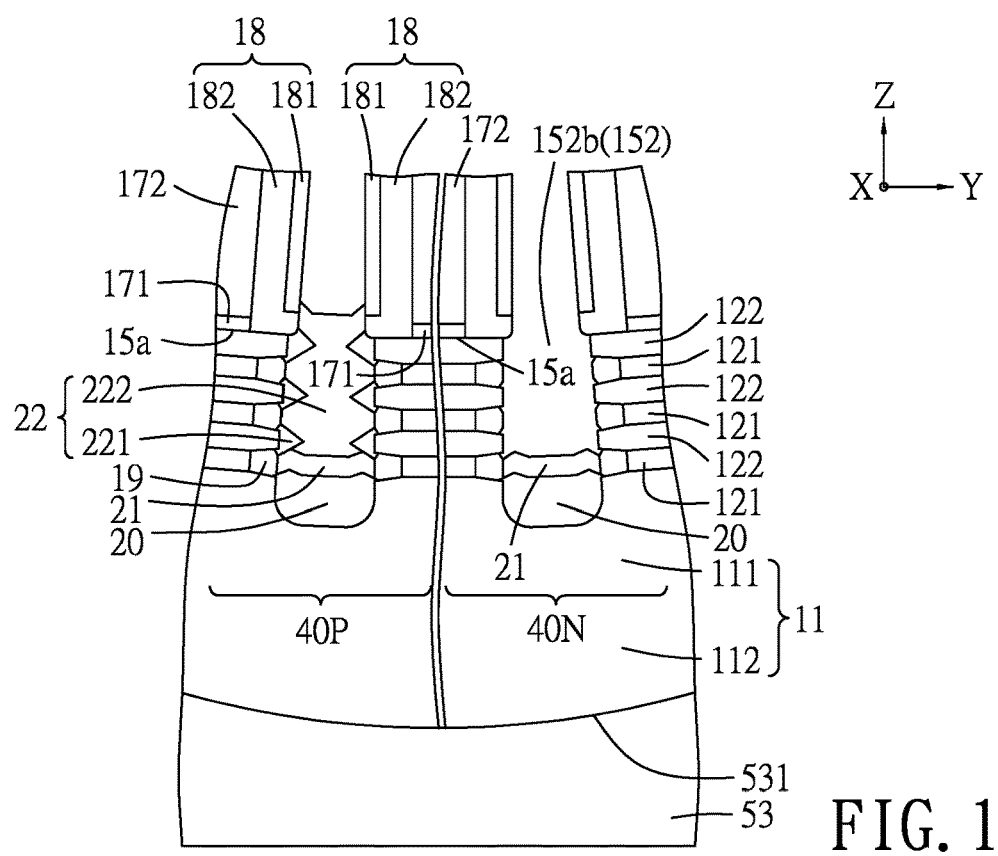

Referring to FIG. 1B and the example illustrated in FIG. 13, the method 100 then proceeds to step 111, where the structure shown in FIG. 11 is bent upwardly. Step 111 may be performed by bending upwardly the structure shown in FIG. 11 through a second bending holder (not shown) and a second bending device 53. In step 111, the structure shown in FIG. 11 is transformed from the flat state to a second bending state. In some embodiments, material and function for the second bending holder may be the same as or similar to those for the first bending holder as described in step 108, and thus details thereof are omitted for the sake of brevity. In some embodiments, the second bending device 53 may have a curved upper surface 531 in contact with the lower surface of the semiconductor substrate 11. In some embodiments, the curved upper surface 531 of the second bending device 53 may be a semi-cylindrical concave surface that has a radius of curvature ranging from about 5 m to about 500 m. In some embodiments, the structure shown in FIG. 11 is bent upwardly to have a semi-cylindrical shape through the second bending holder and the second bending device 53. In step 111, the size of the upper trench portions 152b of the source/drain trenches 152 at the n-FET region 40N may shrink.

In some embodiments, the structure shown in FIG. 11 may be bent upwardly through a second thin film layer (not shown) disposed thereon (e.g., on the backside of the semiconductor substrate 11). There are no particular limitations on the material and process for forming the second thin film layer as long as the second thin film layer can upwardly bend the structure shown in FIG. 11.

Figure 14:
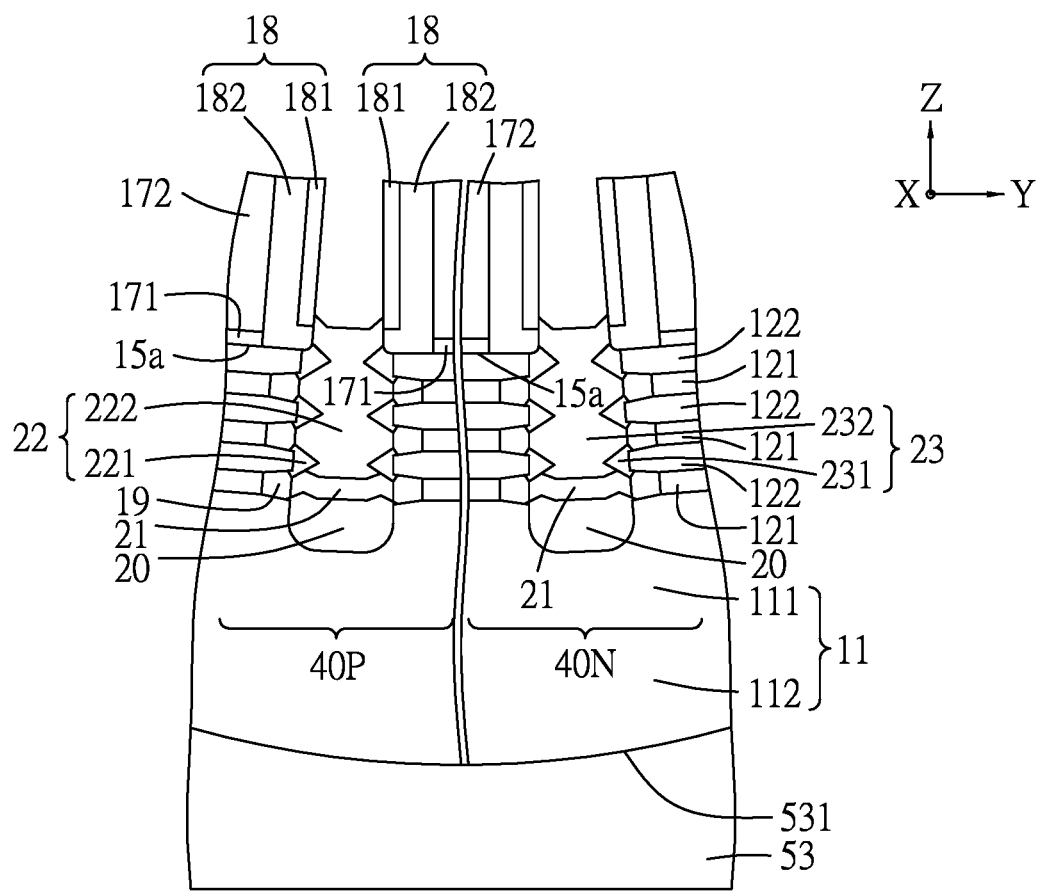

Referring to FIG. 1B and the example illustrated in FIG. 14, the method 100 then proceeds to step 112, where a plurality of the second source/drain features 23 are respectively formed on the second layers 21 in the upper trench portions 152b (see FIG. 13) of the source/drain trenches 152 at the n-FET region 40N. The first layers 20, the second layers 21, and the second source/drain features 23 together serve as second source/drain regions. At the n-FET region 40N, each of the second source/drain features 23 has an n-type conductivity. In some embodiments, each of the second source/drain features 23 includes a plurality of second outer regions 231 and a second major region 232, and each of the second outer regions 231 is disposed between a corresponding one of the channel features 122 and the second major region 232. Step 112 may be performed by sequentially forming the second outer regions 231 and the second major region 232 in the upper trench portions 152b of the source/drain trenches 152 at the n-FET region 40N using an epitaxial growth technique. In some embodiments in which the channel features 122 are made of silicon (Si), both of the second outer regions 231 and the second major region 232 may be made of silicon (Si) so as to provide a better epitaxial growth performance. In some embodiments, the second outer regions 231 may be made of silicon (Si) and the second major region 232 may be made of silicon carbide (SiC). In some embodiments, both of the second outer regions 231 and the second major region 232 may be made of silicon carbide (SiC).

Figure 15A:
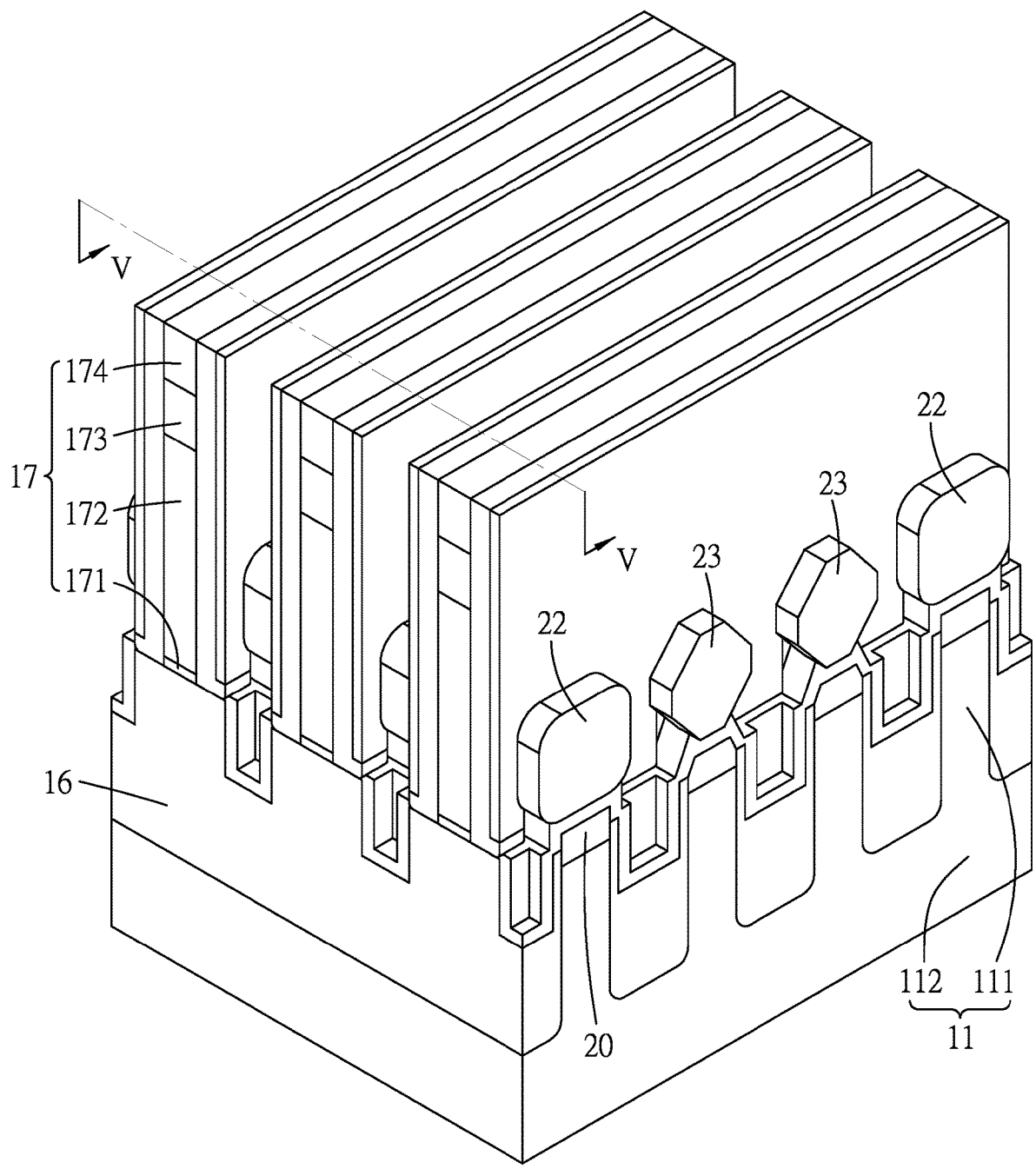
Figure 15B:
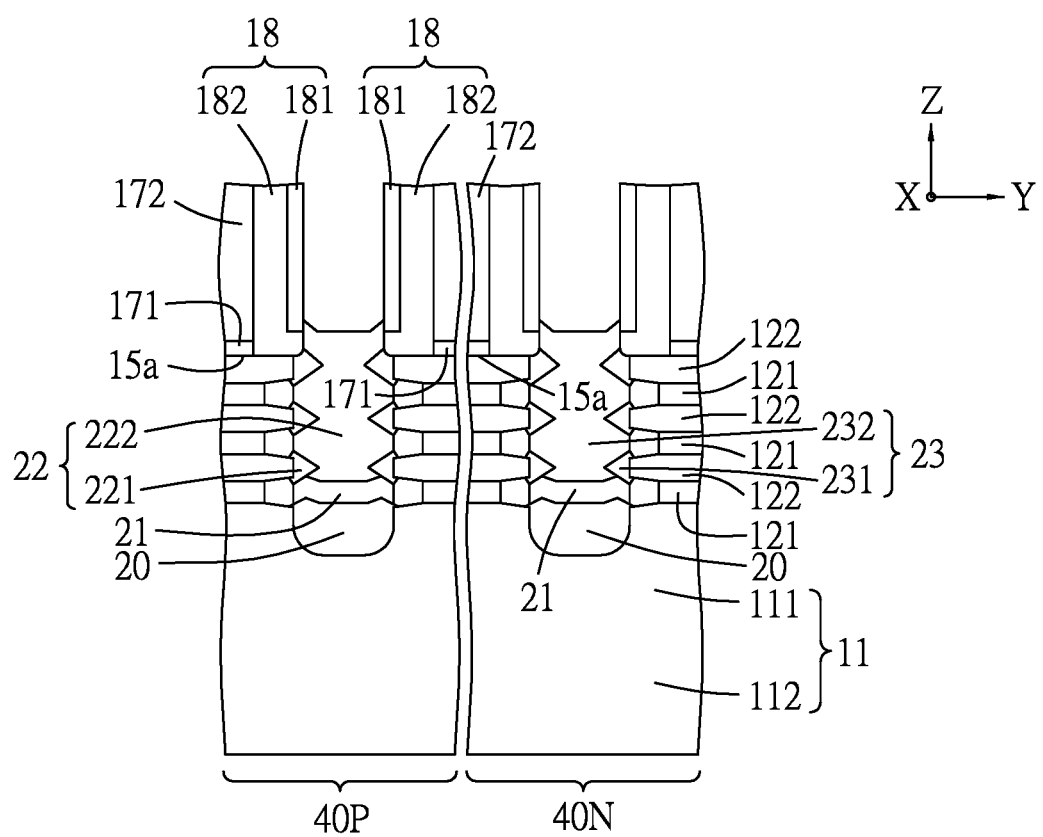

Referring to FIG. 1B and the example illustrated in FIGS. 15A and 15B, the method 100 then proceeds to step 113, where the second bending holder is detached and the structure shown in FIG. 14 is removed from the second bending device 53, such that the structure shown in FIG. 14 is reverted from the second bending state back to the flat state. FIG. 15B illustrates a cross-sectional view taken along line V-V of FIG. 15A. In some embodiments, when the structure shown in FIG. 14 is reverted from the second bending state back to the flat state, the channel features 122 at the n-FET region 40N may undergo a tensile strain ranging from about 0.1 GPa to about 5 GPa, which is capable of enhancing the electron mobility of the channel features 122 at the n-FET region 40N. In some embodiments, when the structure shown in FIG. 11 is bent upwardly (i.e., step 111 shown in FIG. 1B), the structure shown in FIG. 11 may have a radius of curvature ranging from about 5 m to about 500 m. If the radius of curvature of the structure shown in FIG. 11 is smaller than about 5 m, the structure shown in FIG. 11 may be broken due to over-bending thereof. If the radius of curvature of the structure shown in FIG. 11 is greater than about 500 m, the tensile strain may not be induced, and thus, the electron mobility of the channel features 122 at the n-FET region 40N may not be further enhanced.

Therefore, as described above, in addition to the silicon carbide (SIC), which is currently used for forming the source/drain regions of the n-type FET so as to induce the tensile strain in the channel regions of the n-type FET, the silicon (Si) may be alternatively used to form the second source/drain features 23 of the NMOSFET 30N, and the tensile strain in the channel features 122 can also be induced after the structure shown in FIG. 14 is reverted from the second bending state back to the flat state.

In some embodiments, after the structure shown in FIG. 11 is bent upwardly (i.e., step 111 shown in FIG. 1B) and before formation of the second source/drain features 23 (i.e., step 112 shown in FIG. 1B), a second patterned hard mask (not shown) may be formed on the structure at the p-FET region 40P shown in FIG. 13. The material and process for the second patterned hard mask may be similar to those of the first patterned hard mask as mentioned above, and details thereof are omitted for the sake of brevity. After the formation of the second source/drain features 23, the second patterned hard mask is removed from the p-FET region 40P.

In some embodiments, steps 108 to 110 may be performed after step 113 and before step 114.

Figure 16A:
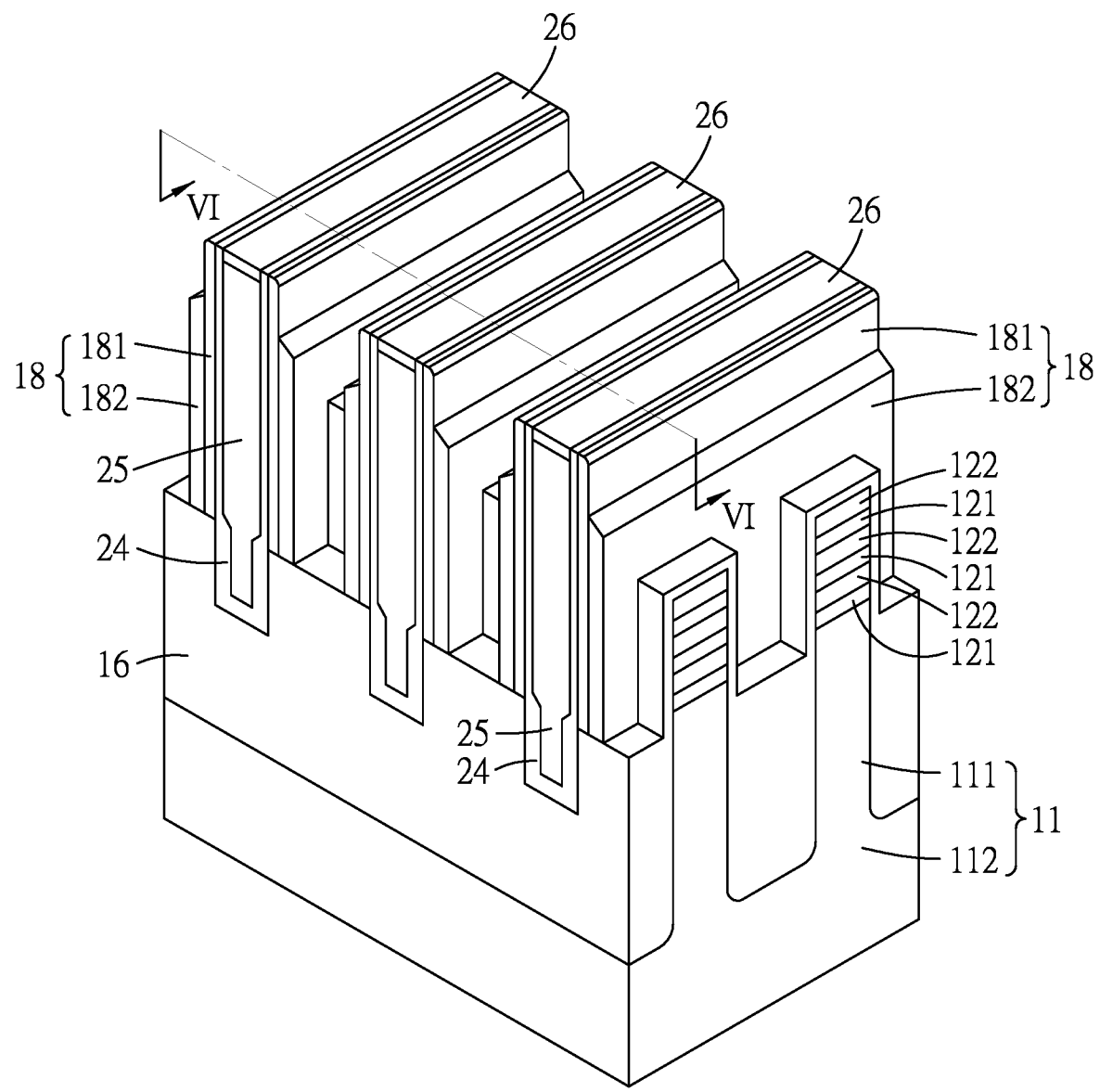
Figure 16B:
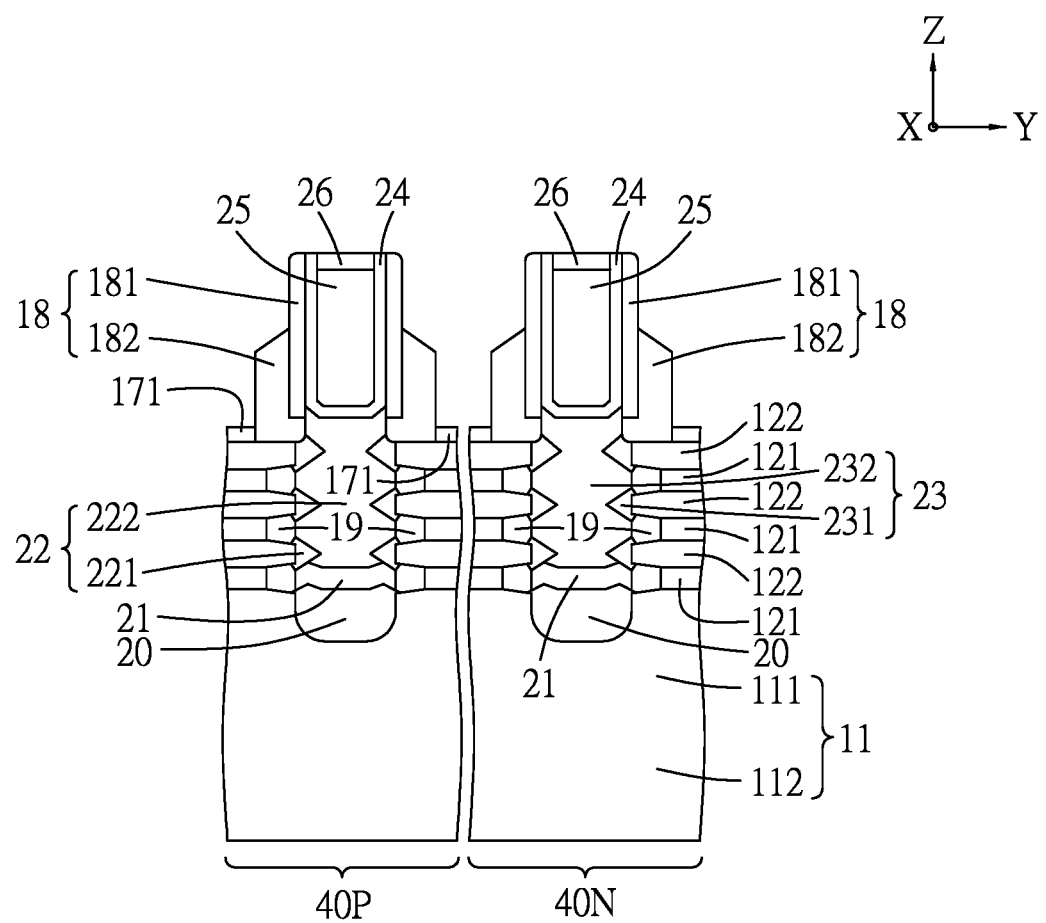

Referring to FIG. 1B and the example illustrated in FIGS. 16A and 16B, the method 100 then proceeds to step 114, where a plurality of contact etch stop features 24, a plurality of inter-layer dielectric (ILD) features 25 and a plurality of nitride features 26 are sequentially and respectively formed on the first and second source/drain features 22, 23, followed by removing the hard mask layer 174, the polish stop layer 173 and the dummy gate electrode 172 of each of the dummy poly gates 17 and partially removing the inner part 182 of each of the gate spacers 18. FIG. 16B illustrates a cross-sectional view taken along line VI-VI of FIG. 16A. Step 114 may include sub-steps 1141 to 1144.

In sub-step 1141, a contact etch stop layer (not shown) for forming the contact etch stop features 24 and a dielectric material layer (not shown) for forming the ILD features 25 are sequentially formed over the structure shown in FIG. 15A (or FIG. 15B) by a blanket deposition process, for example, but not limited to, CVD or molecular layer deposition (MLD). The contact etch stop layer for forming the contact etch stop features 24 may include, for example, but not limited to, silicon nitride, carbon-doped silicon nitride, other suitable contact etch stop materials, or combinations thereof. The dielectric material layer for forming the ILD features 25 may include, for example, but not limited to, silicon oxide, silicon nitride, silicon oxynitride, other suitable dielectric materials, or combinations thereof. Other suitable materials for forming the contact etch stop features 24 and the ILD features 25 are within the contemplated scope of the present disclosure. After formation of the contact etch stop layer and the dielectric material layer, a planarization process, for example, but not limited to, chemical mechanical polishing (CMP) or other suitable planarization processes, is performed to remove excess portions of the contact etch stop layer and the dielectric material layer, so as to obtain the contact etch stop features 24 and the ILD features 25.

In sub-step 1142, the ILD features 25 are partially etched to form a plurality of recesses (not shown), followed by respectively forming the nitride features 26 in the recesses. The ILD features 25 may be partially etched by a suitable etching process, for example, but not limited to, dry etching, wet etching, other suitable etching processes, or combinations thereof. The nitride features 26 may be made of a nitride-based material. Other suitable materials for forming the nitride features 26 are within the contemplated scope of the present disclosure. The nitride features 26 may be formed by conformally depositing a nitride layer on the contact etch stop features 24, the etched ILD features 25 and other structure, followed by performing a planarization process, for example, but not limited to, CMP or other suitable planarization processes, to remove excess portions of the nitride layer, so as to obtain the nitride features 26.

In sub-step 1143, the hard mask layer 174, the polish stop layer 173 and the dummy gate electrode 172 of each of the dummy poly gates 17 are removed by a suitable etching process, for example, but not limited to, dry etching, wet etching, other suitable etching processes, or combinations thereof, until the dummy gate dielectric 171 of each of the dummy poly gates 17 is exposed.

In sub-step 1144, the inner part 182 of each of the gate spacers 18 is partially removed by a suitable etching process, for example, but not limited to, dry etching, wet etching, other suitable etching processes, or combinations thereof.

Figure 17A:
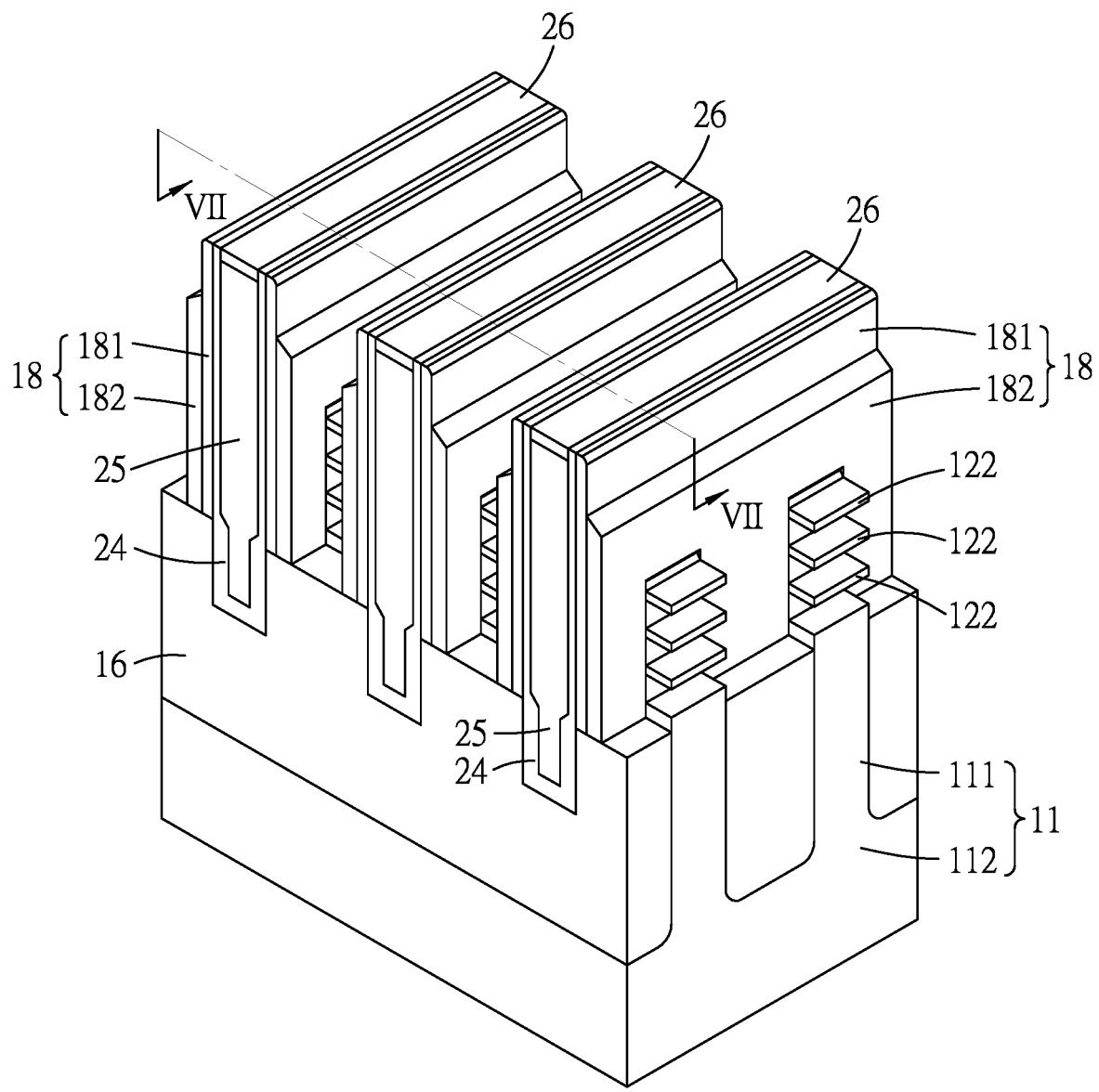
Figure 17B:
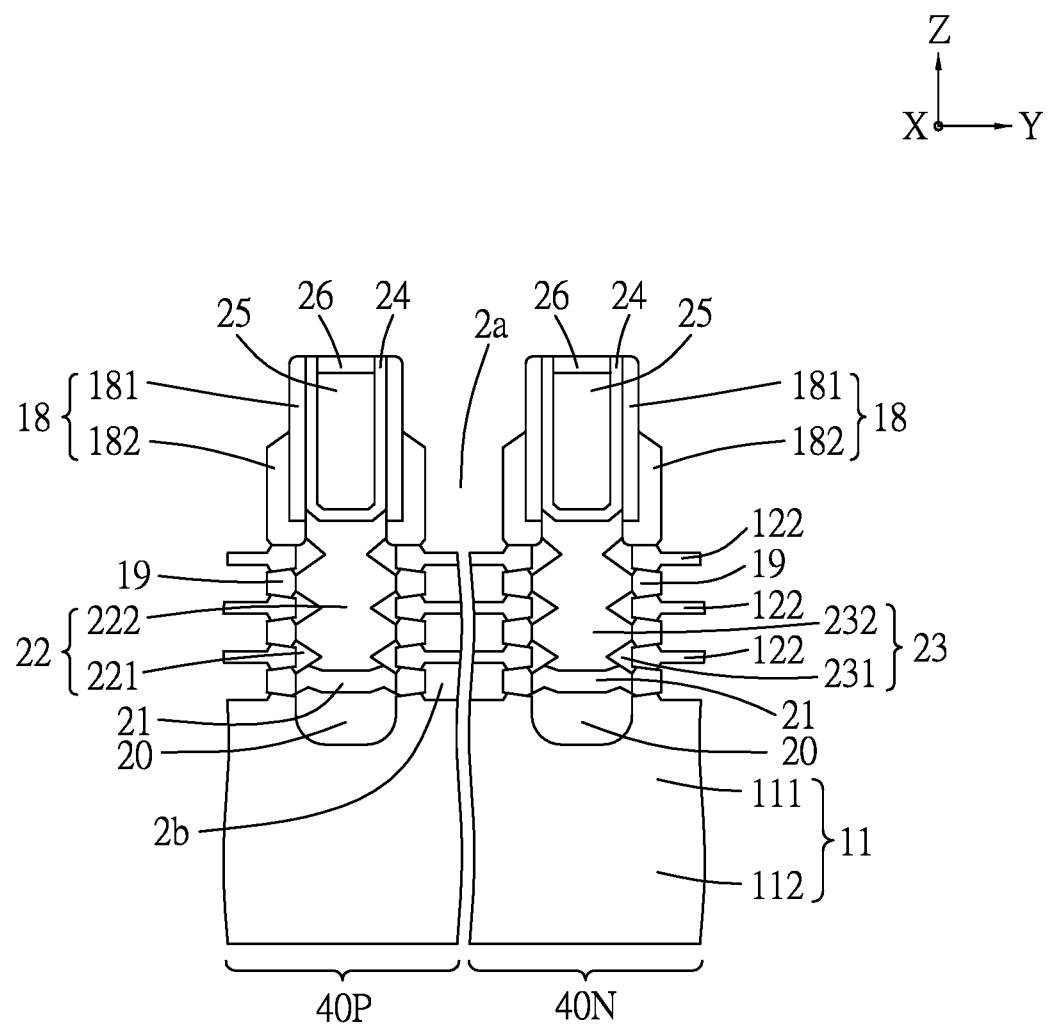

Referring to FIG. 1B and the example illustrated in FIGS. 17A and 17B, the method 100 then proceeds to step 115, where the dummy gate dielectrics 171 and the sacrificial features 121 (see FIG. 16B) are sequentially removed, so as to form a plurality of first voids 2a and a plurality of second voids 2b. FIG. 17B illustrates a cross-sectional view taken along line VII-VII of FIG. 17A. Step 115 may be performed by one or more etching processes. The etching process may include wet etching, dry etching, or a combination thereof. The first voids 2a are defined by the gate spacers 18 and topmost ones of the channel features 122, and the second voids 2b are defined by the inner spacers 19 and the channel features 122. In some embodiments, step 115 may include three etching processes: a first etching process is used to remove the dummy gate dielectrics 171, a second etching process is used to remove the sacrificial features 121, and a third etching process is used to etch oxidized portions of the channel features 122 that are formed in the second etching process.

Figure 18:
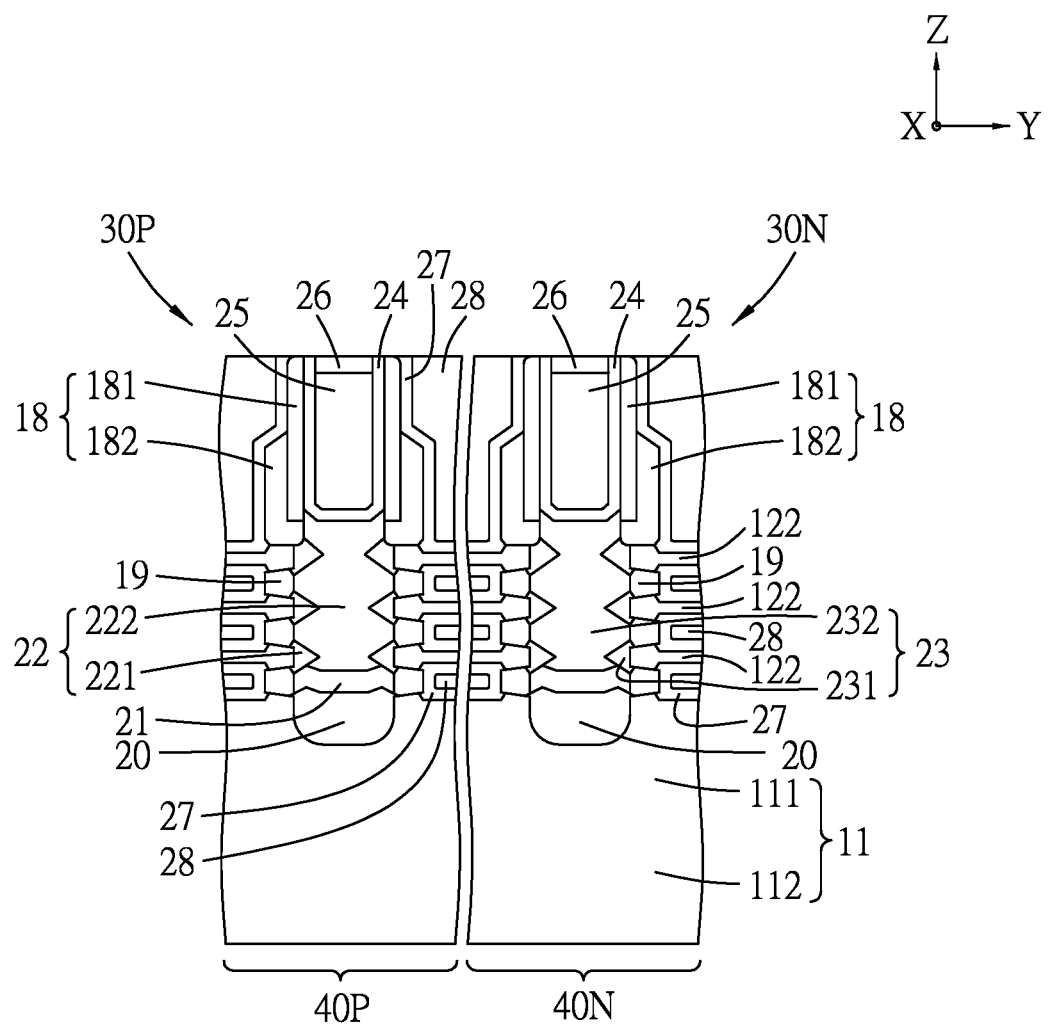

Referring to FIG. 1B and the example illustrated in FIG. 18, the method 100 then proceeds to step 116, where a gate dielectric layer 27 and a metal gate feature 28 are sequentially formed in each of the first voids 2a and the second voids 2b (see FIG. 17B). Step 116 may include sub-step (i) sequentially forming material layers for the gate dielectric layer 27 and the metal gate feature 28 in the first voids 2a and the second voids 2b, and over the gate spacers 18, the contact etch stop features 24 and the nitride features 26; and sub-step (ii) conducting a planarization process (e.g., CMP or other suitable planarization processes) to remove excess portions of the material layers for the gate dielectric layer 27 and the metal gate feature 28 over the gate spacers 18, the contact etch stop features 24 and the nitride features 26, so as to obtain the gate dielectric layer 27 and the metal gate feature 28. The gate dielectric layer 27 may be made of a high k material, for example, but not limited to, hafnium oxide, silicon nitride, silicon oxynitride, titanium oxide, hafnium zirconium oxide, tantalum oxide, hafnium silicon oxide, zirconium oxide, zirconium silicon oxide, lanthanum oxide, aluminum oxide, yttrium oxide, strontium titanate, barium titanate, barium zirconate, lanthanum silicon oxide, aluminum silicon oxide, hafnium lanthanum oxide, hafnium silicon oxide, aluminum silicon oxide, hafnium tantalum oxide, hafnium titanium oxide, or combinations thereof. Other suitable materials for the gate dielectric layer 27 are within the contemplated scope of the present disclosure. The material layer for the gate dielectric layer 27 may be formed by a suitable deposition process, for example, but not limited to, CVD, ALD, or other suitable deposition processes. The metal gate feature 28 may include, for example, but not limited to, aluminum, copper, tungsten, cobalt, ruthenium, titanium, tantalum, molybdenum, nickel, platinum, titanium nitride, tantalum nitride, or combinations thereof. Other suitable conductive materials for the metal gate feature 28 are within the contemplated scope of the present disclosure. The material layer for the metal gate feature 28 may be formed by a suitable deposition process, for example, but not limited to, CVD, ALD, electroless plating, or other suitable deposition processes.

In some embodiments, before formation of the gate dielectric layer 27 and the metal gate feature 28, an interfacial layer (IL) (not shown) is formed on etched portions of the channel features 122. The IL may include silicon oxide. Other suitable materials for the IL are within the contemplated scope of the present disclosure. The IL may be formed by wet chemical process, ALD, thermal oxidation, or combinations thereof.

After the formation of the gate dielectric layer 27 and the metal gate feature 28, the PMOSFET 30P is obtained at the p-FET region 40P and the NMOSFET 30N is obtained at the n-FET region 40N.

In this disclosure, the semiconductor substrate and the structure disposed thereon is transformed from a flat state to a first bending state (i.e., bending downwardly) prior to formation of source/drain features of PMOSFETs, and is transformed from the first bending state to the flat state after the formation of source/drain features of PMOSFETS, so that channel features of the PMOSFETs might undergo the compressive strain ranging from about 0.1 GPa to about 5 GPa. In addition, the semiconductor substrate and the structure disposed thereon is transformed from the flat state to a second bending state (i.e., bending upwardly) prior to formation of source/drain features of NMOSFETs, and is transformed from the second bending state to the flat state after the formation of the source/drain features of NMOSFETs, so that the channel features of the NMOSFETs might undergo the tensile strain ranging from about 0.1 GPa to about 5 GPa. Such compressive strain and tensile strain are capable of respectively enhancing the hole mobility in the channel features of the PMOSFETs and the electron mobility in the channel features of the NMOSFETs, thereby further improving the device performance of the PMOSFETs and NMOSFETs.

In accordance with some embodiments of the present disclosure, a method for manufacturing a semiconductor device includes: forming a semiconductor stack on a semiconductor substrate in a flat state, the semiconductor stack including a plurality of sacrificial layer portions and a plurality of channel layer portions that are alternately stacked over one another along a first direction; forming a plurality of source/drain trenches in the semiconductor stack spaced apart from each other along a second direction transverse to the first direction, each of the source/drain trenches penetrating the channel layer portions, the sacrificial layer portions and an upper portion of the semiconductor substrate, and terminating at a lower portion of the semiconductor substrate, so as to form the channel layer portions into channel features and form the sacrificial layer portions into sacrificial features, each of the source/drain trenches having a first size in the second direction; transforming the semiconductor substrate from the flat state to a bending state, such that each of the source/drain trenches has a second size in the second direction, the second size being different from the first size; forming a plurality of source/drain regions in the source/drain trenches, respectively; and reverting the semiconductor substrate from the bending state back to the flat state, so as to induce a strain in the channel features.

In accordance with some embodiments of the present disclosure, in the bending state, the semiconductor substrate is bent downwardly to have a semi-cylindrical shape, such that the second size is larger than the first size.

In accordance with some embodiments of the present disclosure, in the bending state, the semiconductor substrate has a radius of curvature ranging from 5 m to 500 m.

In accordance with some embodiments of the present disclosure, the strain induced in the channel features is a compressive strain ranging from 0.1 GPa to 5 GPa.

In accordance with some embodiments of the present disclosure, in the bending state, the semiconductor substrate is bent upwardly to have a semi-cylindrical shape, such that the second size is smaller than the first size.

In accordance with some embodiments of the present disclosure, in the bending state, the semiconductor substrate has a radius of curvature ranging from 5 m to 500 m.

In accordance with some embodiments of the present disclosure, the strain induced in the channel features is a tensile strain ranging from 0.1 GPa to 5 GPa.

In accordance with some embodiments of the present disclosure, formation of the source/drain regions in the source/drain trenches includes: forming a plurality of first layers in the source/drain trenches, respectively, the first layers being made of a semiconductor material; forming a plurality of second layers on the first layers and in the source/drain trenches, respectively, the second layers being made of a dielectric material; and forming a plurality of source/drain features on the second layers and in the source/drain trenches, respectively.

In accordance with some embodiments of the present disclosure, a method for manufacturing a semiconductor device includes: forming a plurality of semiconductor structures on a semiconductor substrate in a flat state, the semiconductor structures being separated from one another by a plurality of source/drain trenches in a first direction, each of the semiconductor structures including a plurality of sacrificial features and a plurality of channel features that are alternately stacked over one another along a second direction transverse to the first direction; forming a plurality of first layers in the source/drain trenches, respectively, the first layers being made of a semiconductor material; forming a plurality of second layers on the first layers and in the source/drain trenches, respectively, the second layers being made of a dielectric material; bending the semiconductor substrate downwardly from the flat state to a bending state, so that upper trench portions of the source/drain trenches have an enlarged size; forming a plurality of source/drain features on the second layers in the source/drain trenches, respectively, the source/drain features having a p-type conductivity; and reverting the semiconductor substrate from the bending state back to the flat state, so as to induce a compressive strain in the channel features.

In accordance with some embodiments of the present disclosure, in the bending state, the semiconductor substrate has a semi-cylindrical shape.

In accordance with some embodiments of the present disclosure, in the bending state, the semiconductor substrate has a radius of curvature ranging from 5 m to 500 m.

In accordance with some embodiments of the present disclosure, the semiconductor substrate is bent downwardly from the flat state to the bending state by disposing the semiconductor substrate on a bending device, such that a lower surface of the semiconductor substrate opposite to the semiconductor structures is in contact with a convex upper surface of the bending device.

In accordance with some embodiments of the present disclosure, the semiconductor substrate is bent downwardly from the flat state to the bending state by forming a thin film layer on a backside of the semiconductor substrate opposite to the semiconductor structures, the thin film layer being made of silicon carbon nitride (SiCN), silicon nitride (SiN), aluminum oxide (AlO), hafnium oxide (H$_f$O), titanium oxide (TiO), or silicon oxide (SiO).

In accordance with some embodiments of the present disclosure, the thin film layer has a thickness ranging from 1 nm to 100 nm.

In accordance with some embodiments of the present disclosure, the thin film layer is formed as a plurality of strips spaced apart from each other.

In accordance with some embodiments of the present disclosure, a method for manufacturing a semiconductor device includes: forming a plurality of semiconductor structures on a semiconductor substrate in a flat state, the semiconductor structures being separated from one another by a plurality of source/drain trenches in a first direction, each of the semiconductor structures including a plurality of sacrificial features and a plurality of channel features that are alternately stacked over one another along a second direction transverse to the first direction; forming a plurality of first layers in the source/drain trenches, respectively, the first layers being made of a semiconductor material; forming a plurality of second layers on the first layers and in the source/drain trenches, respectively, the second layers being made of a dielectric material; bending the semiconductor substrate upwardly from the flat state to a bending state, so that upper trench portions of the source/drain trenches have a shrinking size; forming a plurality of source/drain features on the second layers in the source/drain trenches, respectively, the source/drain features having an n-type conductivity; and reverting the semiconductor substrate from the bending state back to the flat state, so as to induce a tensile strain in the channel features.

In accordance with some embodiments of the present disclosure, in the bending state, the semiconductor substrate has a semi-cylindrical shape.

In accordance with some embodiments of the present disclosure, in the bending state, the semiconductor substrate has a radius of curvature ranging from 5 m to 500 m.

In accordance with some embodiments of the present disclosure, the semiconductor substrate is bent upwardly from the flat state to the bending state by disposing the semiconductor substrate on a bending device, such that a lower surface of the semiconductor substrate opposite to the semiconductor structures is in contact with a concave upper surface of the bending device.

In accordance with some embodiments of the present disclosure, the concave upper surface is a semi-cylindrical concave surface that has a radius of curvature ranging from 5 m to 500 m.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a semiconductor stack on a semiconductor substrate in a flat state, the semiconductor stack including a plurality of sacrificial layer portions and a plurality of channel layer portions that are alternately stacked over one another along a first direction;
    forming a plurality of source/drain trenches in the semiconductor stack spaced apart from each other along a second direction transverse to the first direction, each of the source/drain trenches penetrating the channel layer portions, the sacrificial layer portions and an upper portion of the semiconductor substrate, and terminating at a lower portion of the semiconductor substrate, so as to form the channel layer portions into channel features and form the sacrificial layer portions into sacrificial features, each of the source/drain trenches having a first size in the second direction;
    transforming the semiconductor substrate from the flat state to a bending state, such that each of the source/drain trenches has a second size in the second direction, the second size being different from the first size;
    forming a plurality of source/drain regions in the source/drain trenches, respectively; and
    reverting the semiconductor substrate from the bending state back to the flat state, so as to induce a strain in the channel features.

2. The method as claimed in claim 1, wherein, in the bending state, the semiconductor substrate is bent downwardly to have a semi-cylindrical shape, such that the second size is larger than the first size.

3. The method as claimed in claim 2, wherein, in the bending state, the semiconductor substrate has a radius of curvature ranging from 5 m to 500 m.

4. The method as claimed in claim 2, wherein the strain induced in the channel features is a compressive strain ranging from 0.1 GPa to 5 GPa.

5. The method as claimed in claim 1, wherein, in the bending state, the semiconductor substrate is bent upwardly to have a semi-cylindrical shape, such that the second size is smaller than the first size.

6. The method as claimed in claim 5, wherein, in the bending state, the semiconductor substrate has a radius of curvature ranging from 5 m to 500 m.

7. The method as claimed in claim 5, wherein the strain induced in the channel features is a tensile strain ranging from 0.1 GPa to 5 GPa.

8. The method as claimed in claim 1, wherein formation of the source/drain regions in the source/drain trenches includes:
    forming a plurality of first layers in the source/drain trenches, respectively, the first layers being made of a semiconductor material;
    forming a plurality of second layers on the first layers and in the source/drain trenches, respectively, the second layers being made of a dielectric material; and
    forming a plurality of source/drain features on the second layers and in the source/drain trenches, respectively.

9. A method for manufacturing a semiconductor device, comprising:
    forming a plurality of semiconductor structures on a semiconductor substrate in a flat state, the semiconductor structures being separated from one another by a plurality of source/drain trenches in a first direction, each of the semiconductor structures including a plurality of sacrificial features and a plurality of channel features that are alternately stacked over one another along a second direction transverse to the first direction;

forming a plurality of first layers in the source/drain trenches, respectively, the first layers being made of a semiconductor material;

forming a plurality of second layers on the first layers and in the source/drain trenches, respectively, the second layers being made of a dielectric material;

bending the semiconductor substrate downwardly from the flat state to a bending state, so that upper trench portions of the source/drain trenches have an enlarged size;

forming a plurality of source/drain features on the second layers in the source/drain trenches, respectively, the source/drain features having a p-type conductivity; and reverting the semiconductor substrate from the bending state back to the flat state, so as to induce a compressive strain in the channel features.

10. The method as claimed in claim 9, wherein, in the bending state, the semiconductor substrate has a semi-cylindrical shape.

11. The method as claimed in claim 9, wherein, in the bending state, the semiconductor substrate has a radius of curvature ranging from 5 m to 500 m.

12. The method as claimed in claim 9, wherein the semiconductor substrate is bent downwardly from the flat state to the bending state by disposing the semiconductor substrate on a bending device, such that a lower surface of the semiconductor substrate opposite to the semiconductor structures is in contact with a convex upper surface of the bending device.

13. The method as claimed in claim 9, wherein the semiconductor substrate is bent downwardly from the flat state to the bending state by forming a thin film layer on a backside of the semiconductor substrate opposite to the semiconductor structures, the thin film layer being made of silicon carbon nitride (SiCN), silicon nitride (SiN), aluminum oxide (AlO), hafnium oxide ($H_fO$), titanium oxide (TiO), or silicon oxide (SiO).

14. The method as claimed in claim 13, wherein the thin film layer has a thickness ranging from 1 nm to 100 nm.

15. The method as claimed in claim 13, wherein the thin film layer is formed as a plurality of strips spaced apart from each other.

16. A method for manufacturing a semiconductor device, comprising:

forming a plurality of semiconductor structures on a semiconductor substrate in a flat state, the semiconductor structures being separated from one another by a plurality of source/drain trenches in a first direction, each of the semiconductor structures including a plurality of sacrificial features and a plurality of channel features that are alternately stacked over one another along a second direction transverse to the first direction;

forming a plurality of first layers in the source/drain trenches, respectively, the first layers being made of a semiconductor material;

forming a plurality of second layers on the first layers and in the source/drain trenches, respectively, the second layers being made of a dielectric material;

bending the semiconductor substrate upwardly from the flat state to a bending state, so that upper trench portions of the source/drain trenches have a shrinking size;

forming a plurality of source/drain features on the second layers in the source/drain trenches, respectively, the source/drain features having an n-type conductivity; and reverting the semiconductor substrate from the bending state back to the flat state, so as to induce a tensile strain in the channel features.

17. The method as claimed in claim 16, wherein, in the bending state, the semiconductor substrate has a semi-cylindrical shape.

18. The method as claimed in claim 16, wherein, in the bending state, the semiconductor substrate has a radius of curvature ranging from 5 m to 500 m.

19. The method as claimed in claim 16, wherein the semiconductor substrate is bent upwardly from the flat state to the bending state by disposing the semiconductor substrate on a bending device, such that a lower surface of the semiconductor substrate opposite to the semiconductor structures is in contact with a concave upper surface of the bending device.

20. The method as claimed in claim 19, wherein the concave upper surface is a semi-cylindrical concave surface that has a radius of curvature ranging from 5 m to 500 m.

* * * * *